(12) United States Patent
He et al.

(10) Patent No.: US 11,816,284 B2
(45) Date of Patent: Nov. 14, 2023

(54) TOUCH PANEL AND MANUFACTURING METHOD THEREFORE, AND TOUCH DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Fan He, Beijing (CN); Xiangdan Dong, Beijing (CN); Hongwei Ma, Beijing (CN); Jun Yan, Beijing (CN); Kemeng Tong, Beijing (CN); Cong Fan, Beijing (CN)

(73) Assignees: Chengdu Boe Optoelectronics Technology Co., LTD., Sichuan (CN); Boe Technology Group Co., LTD., Beijing (CN)

( * ) Notice: Subject to any disclaimer, the term of this patent is extended or adjusted under 35 U.S.C. 154(b) by 60 days.

(21) Appl. No.: 17/620,579

(22) PCT Filed: Jan. 14, 2021

(86) PCT No.: PCT/CN2021/071732
§ 371 (c)(1),
(2) Date: Dec. 17, 2021

(87) PCT Pub. No.: WO2021/143760
PCT Pub. Date: Jul. 22, 2021

(65) Prior Publication Data
US 2023/0152920 A1     May 18, 2023

(30) Foreign Application Priority Data
Jan. 17, 2020 (CN) .......................... 202010053361.8

(51) Int. Cl.
*G06F 3/041* (2006.01)
*G06F 3/044* (2006.01)
(Continued)

(52) U.S. Cl.
CPC .......... *G06F 3/04164* (2019.05); *G06F 3/044* (2013.01); *G06F 3/0416* (2013.01);
(Continued)

(58) Field of Classification Search
CPC ................. G06F 3/044; G06F 3/04164; G06F 2203/04102; G06F 2203/04103;
(Continued)

(56) References Cited

U.S. PATENT DOCUMENTS

2017/0083052 A1* 3/2017 Hong .................. B32B 7/12
2017/0262109 A1   9/2017 Choi et al.
(Continued)

FOREIGN PATENT DOCUMENTS

CN    107180848 A    9/2017
CN    107422931 A    12/2017
(Continued)

OTHER PUBLICATIONS

Office Action for application 202010053361.8 issued by the Chinese Intellectual Property Office dated May 31, 2021.

*Primary Examiner* — Darlene M Ritchie
(74) *Attorney, Agent, or Firm* — IP & T GROUP LLP

(57) ABSTRACT

A touch panel includes a carrier panel, a plurality of touch electrodes and a plurality of touch lines. The carrier panel has a bendable region and a non-bendable region. The plurality of touch electrodes and the plurality of touch lines are disposed on the carrier panel, and a touch electrode of the plurality of touch electrodes is electrically connected to one or more touch lines. A portion of at least one touch line located in the bendable region is a single-layer metal line, (Continued)

and at least a part of a portion of the at least one touch line located in the non-bendable region is a double-layer metal line.

20 Claims, 19 Drawing Sheets

(51) Int. Cl.
*H10K 59/123* (2023.01)
*H10K 59/131* (2023.01)
*H10K 59/40* (2023.01)
*H10K 59/121* (2023.01)

(52) U.S. Cl.
CPC .......... *G06F 3/0443* (2019.05); *G06F 3/0445* (2019.05); *G06F 3/0446* (2019.05); *G06F 3/0448* (2019.05); *H10K 59/123* (2023.02); *H10K 59/1315* (2023.02); *G06F 2203/04102* (2013.01); *G06F 2203/04103* (2013.01); *G06F 2203/04111* (2013.01); *G06F 2203/04112* (2013.01); *H10K 59/1213* (2023.02); *H10K 59/40* (2023.02)

(58) Field of Classification Search
CPC ......... G06F 2203/04112; G06F 3/0416; G06F 3/0443; G06F 3/0445; G06F 3/0446; G06F 3/0448; G06F 2203/04111; H10K 59/131; H10K 59/123; H10K 59/1315; H10K 59/12; H10K 59/1213; H10K 59/40; G02F 1/13629
See application file for complete search history.

(56) References Cited

U.S. PATENT DOCUMENTS

| | | | |
|---|---|---|---|
| 2019/0121479 A1 | 4/2019 | Lee | |
| 2021/0072797 A1 | 3/2021 | He et al. | |
| 2022/0066504 A1* | 3/2022 | Jeong | G06F 3/0446 |
| 2022/0231112 A1* | 7/2022 | Rhe | G06F 3/044 |
| 2022/0254866 A1* | 8/2022 | Kim | H10K 59/1213 |
| 2023/0105238 A1* | 4/2023 | Wang | G09G 3/3225 257/40 |

FOREIGN PATENT DOCUMENTS

| | | |
|---|---|---|
| CN | 109710103 A | 5/2019 |
| CN | 110518021 A | 11/2019 |
| CN | 111261679 A | 6/2020 |
| JP | 2016-219049 A | 12/2016 |

* cited by examiner

A-A'

G-G'
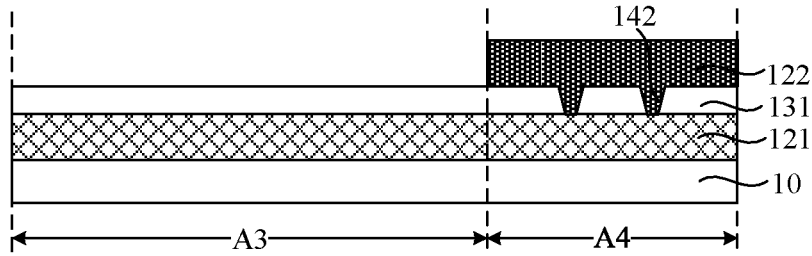
FIG. 21B
G-G'
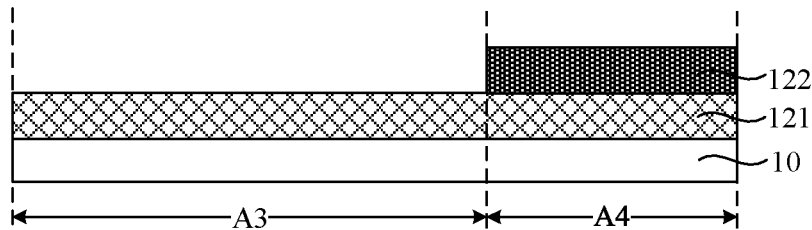
FIG. 21C
| Form a plurality of touch electrodes and a plurality of touch lines on a carrier panel, and a touch electrode of the plurality of touch electrodes is electrically connected to one or more touch lines | — S10 |
FIG. 22

Form a first metal film, and pattern the first metal film to form a first metal pattern layer, the first metal pattern layer including a plurality of first touch electrodes, a plurality of touch sub-electrodes and a plurality of first metal lines, each first touch electrode of the plurality of first touch electrodes being a whole electrode, the plurality of touch sub-electrodes being arranged in an array, and two adjacent touch sub-electrodes being separated by a first touch electrode — S100

Form a first insulating layer, the first insulating layer having first via holes and one or more second via holes — S101

Form a second metal film, and pattern the second metal film to form a second metal pattern layer, the second metal pattern layer including a plurality of connection portions and a plurality of second metal lines, each connection portion of the plurality of connection portions electrically connecting two adjacent touch sub-electrodes through at least two first via holes to form a second touch electrode, an orthogonal projection of a connection portion on the carrier panel and an orthogonal projection of a first touch electrode on the carrier panel having an overlapping region, a first metal line and a second metal line being electrically connected through at least one second via hole to form a double-layer metal line, and the first metal pattern layer or the second metal pattern layer further including the single-layer metal line. — S102

FIG. 23

TOUCH PANEL AND MANUFACTURING METHOD THEREFORE, AND TOUCH DISPLAY APPARATUS

CROSS-REFERENCE TO RELATED APPLICATIONS

This application is a national phase entry under 35 USC 371 of International Patent Application No. PCT/CN2021/071732, filed on Jan. 14, 2021, which claims priority to Chinese Patent Application No. 202010053361.8, filed on, Jan. 17, 2020, which are incorporated herein by reference in their entirety.

TECHNICAL FIELD

The present disclosure relates to the field of touch display technologies, and in particular, to a touch panel and a manufacturing method therefor, and a touch display apparatus.

BACKGROUND

At present, touch display technologies are in a rapid development period, for example, a flexible and foldable touch display apparatus having a touch display function has received widespread attention.

SUMMARY

In an aspect, a touch panel is provided. The touch panel includes: a carrier panel, a plurality of touch electrodes, and a plurality of touch lines. The carrier panel has a bendable region and a non-bendable region. The plurality of touch electrodes and the plurality of touch lines are disposed on the carrier panel, and a touch electrode of the plurality of touch electrodes is electrically connected to one or more touch lines. A portion of at least one touch line located in the bendable region is a single-layer metal line, and at least a part of a portion of the at least one touch line located in the non-bendable region is a double-layer metal line.

In some embodiments, all of the portion of the at least one touch line located in the non-bendable region is a double-layer metal line.

In some embodiments, the non-bendable region includes at least one adjacent region proximate to the bendable region, and a non-adjacent region located at a side of the adjacent region away from the bendable region. A portion of the at least one touch line located in the adjacent region is a single-layer metal line, and a portion of the at least one touch line located in the non-adjacent region is the double-layer metal line.

In some embodiments, a dimension of the adjacent region in a first direction is less than a dimension of the non-adjacent region in the first direction. The first direction is parallel to a surface, provided with the plurality of touch electrodes and the plurality of touch lines thereon, of the carrier panel and perpendicular to a boundary of the bendable region proximate to the adjacent region.

In some embodiments, the plurality of touch electrodes include a plurality of first touch electrodes and a plurality of second touch electrodes, the plurality of first touch electrodes and the plurality of second touch electrodes are arranged crosswise and are insulated from each other.

In some embodiments, each first touch electrode of the plurality of first touch electrodes is a whole electrode. Each second touch electrode of the plurality of second touch electrodes includes a plurality of touch sub-electrodes and a plurality of connection portions, and two adjacent touch sub-electrodes in the second touch electrode are separated by a first touch electrode. The touch panel further includes a first insulating layer. The plurality of first touch electrodes and the plurality of touch sub-electrodes are disposed in a same layer, and the plurality of first touch electrodes and the plurality of connection portions are located on both sides of the first insulating layer.

In some embodiments, the first insulating layer has a plurality of first via holes, and the two adjacent touch sub-electrodes in the second touch electrode are electrically connected to a connection portion of the plurality of connection portions through at least two first via holes in the first insulating layer.

In some embodiments, the first touch electrodes and the touch sub-electrodes each have a metal mesh structure.

In some embodiments, the double-layer metal line includes a first metal line and a second metal line. The first metal line and the plurality of first touch electrodes are disposed in a same layer, and the second metal line and the plurality of connection portions are disposed in a same layer. And/or the single-layer metal line is disposed in a same layer as the plurality of first touch electrodes or the plurality of connection portions.

In some embodiments, the double-layer metal line includes the first metal line and the second metal line. The first metal line and the second metal line are located on the both sides of the first insulating layer. The first insulating layer further has one or more second via holes, and the first metal line and the second metal line are electrically connected through at least one second via hole in the first insulating layer.

In some embodiments, each first touch electrode of the plurality of first touch electrodes is a whole electrode, and each second touch electrode of the plurality of second touch electrodes is a whole electrode. The touch panel further includes a second insulating layer disposed between the plurality of first touch electrodes and the plurality of second touch electrodes. The double-layer metal line includes a first metal line and a second metal line. The first metal line and the plurality of first touch electrodes are disposed in a same layer, and the second metal line and the plurality of second touch electrodes are disposed in a same layer. The second insulating layer further has one or more third via holes, and the first metal line and the second metal line are electrically connected through at least one third via hole in the second insulating layer. And/or the single-layer metal line is disposed in a same layer as the plurality of first touch electrodes or the plurality of second touch electrodes.

In some embodiments, the plurality of touch electrodes are arranged in an array, and each touch line is connected to a touch electrode of the plurality of touch electrodes. The touch panel further includes a third insulating layer located on a side of the plurality of touch electrodes away from the carrier panel. The double-layer metal line includes a first metal line and a second metal line. The first metal line and the plurality of touch electrodes are disposed in a same layer, and the second metal line is disposed on a side of the third insulating layer away from the carrier panel. The third insulating layer has one or more fourth via holes, and the first metal line and the second metal line are electrically connected through at least one fourth via hole in the third insulating layer. And/or the single-layer metal line is disposed in a same layer as the plurality of touch electrodes or is located on the side of the third insulating layer away from the carrier panel.

In some embodiments, each touch line has a same length or an approximately same length.

In some embodiments, an orthogonal projection of the first metal line on the carrier panel approximately overlaps with an orthogonal projection of the second metal line on the carrier panel.

In some embodiments, the bendable region is located in a middle or an edge of the touch panel 100.

In another aspect, a touch display apparatus is provided. The touch display apparatus includes the touch panel as described in any of the above embodiments.

In yet another aspect, a manufacturing method for a touch panel is provided. The manufacturing method includes: forming a plurality of touch electrodes and a plurality of touch lines on a carrier panel, and a touch electrode of the plurality of touch electrodes being electrically connected to one or more touch lines; wherein the carrier panel has a bendable region and a non-bendable region, a portion of at least one touch line located in the bendable region is a single-layer metal line, and at least a part of a portion of the at least one touch line located in the non-bendable region is a double-layer metal line.

In some embodiments, forming the plurality of touch electrodes and the plurality of touch lines on the carrier panel, includes: forming a first metal film; patterning the first metal film to form a first metal pattern layer, the first metal pattern layer including a plurality of first touch electrodes, a plurality of touch sub-electrodes and a plurality of first metal lines; wherein each first touch electrode of the plurality of first touch electrodes is a whole electrode, the plurality of touch sub-electrodes is arranged in an array, and two adjacent touch sub-electrodes are separated by a first touch electrode; forming a first insulating layer, the first insulating layer having a plurality of first via holes and one or more second via holes; forming a second metal film; and patterning the second metal film to form a second metal pattern layer, the second metal pattern layer including a plurality of connection portions and a plurality of second metal lines; wherein each connection portion of the plurality of connection portions electrically connects two adjacent touch sub-electrodes through at least two first via holes to form a second touch electrode, a connection portion and a first touch electrode have a cross region; a first metal line and a second metal line are electrically connected through at least one second via hole to form the double-layer metal line; and the first metal pattern layer or the second metal pattern layer further includes the single-layer metal line.

In some embodiments, forming the plurality of touch electrodes and the plurality of touch lines on the carrier panel, includes: forming a first metal film; patterning the first metal film to form a first metal pattern layer, the first metal pattern layer including a plurality of first touch electrodes and a plurality of first metal lines; wherein each first touch electrode of the plurality of first touch electrodes is a whole electrode; forming a second insulating layer, the second insulating layer having one or more third via holes; forming a second metal film; and patterning the second metal film to form a second metal pattern layer, the second metal pattern layer including a plurality of second touch electrodes and a plurality of second metal lines; wherein each second touch electrode of the plurality of second touch electrodes is a whole electrode; a connection portion and a first touch electrode have a cross region; a second metal line and a first metal line are electrically connected through at least one third via hole to form the double-layer metal line; and the first metal pattern layer or the second metal pattern layer further includes the single-layer metal line.

In some embodiments, forming the plurality of touch electrodes and the plurality of touch lines on the carrier panel, includes: forming a first metal film; patterning the first metal film to form a first metal pattern layer, the first metal pattern layer including a plurality of touch electrodes and a plurality of first metal lines; wherein the plurality of touch electrodes are arranged in an array; forming a third insulating layer, the third insulating layer having one or more fourth via holes; forming a second metal film; and patterning the second metal film to form a second metal pattern layer, the second metal pattern layer including a plurality of second metal lines; wherein a second metal line and a first metal line are electrically connected through at least one fourth via hole to form the double-layer metal line, and the first metal pattern layer or the second metal pattern layer further includes the single-layer metal line.

In some embodiments, the at least one touch line includes the plurality of touch lines; or the at least one touch line includes part of the plurality of touch lines, and each touch line of remaining part of the plurality of touch lines is all located in the non-bendable region, and is a double-layer metal line.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals to which the embodiments of the present disclosure relate.

FIG. 21B is another sectional view taken along the line G-G' in FIG. 14;

FIG. 21C is yet another sectional view taken along the line G-G' in FIG. 14;

FIG. 22 is a flow diagram of a manufacturing method for a touch panel, in accordance with some embodiments;

FIG. 23 is a flow diagram of a manufacturing method for another touch panel, in accordance with some embodiments;

DETAILED DESCRIPTION

Figure 1:
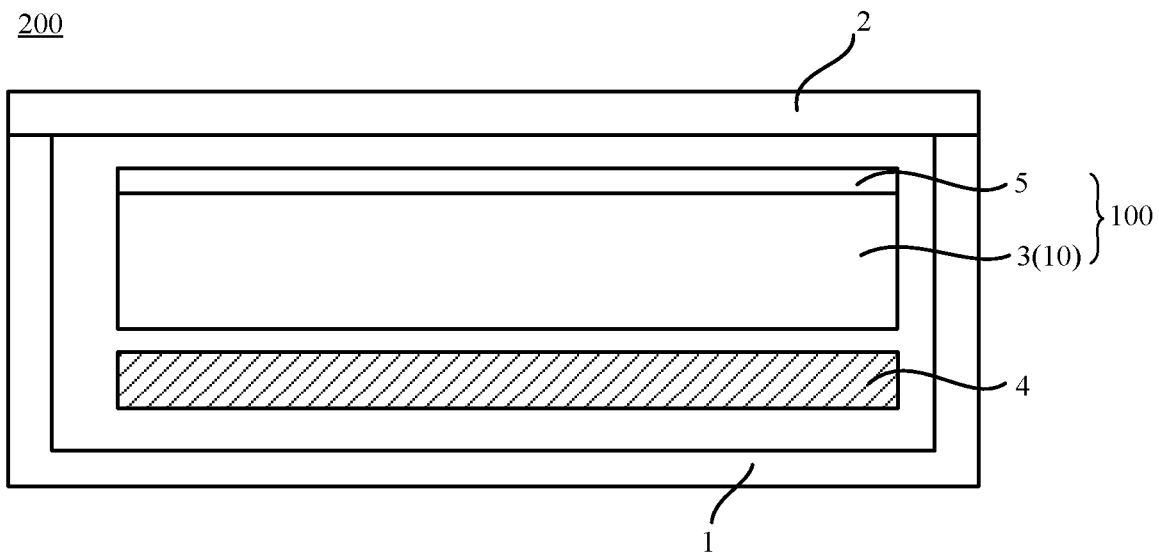
FIG. 1 is a structural diagram of a touch display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and its extensions may be used. For example, the term "connected" may be used in the description of some embodiments to indicate that two or more components are in direct physical contact or electrical contact with each other. The embodiments disclosed herein are not necessarily limited to the contents herein.

The phrase "A and/or B" includes the following three combinations: only A, only B, and a combination of A and B.

The use of the phrase "applicable to" or "configured to" herein means an open and inclusive language, which does not exclude devices that are applicable to or configured to perform additional tasks or steps.

In addition, the use of the phase "based on" means openness and inclusiveness, since a process, step, calculation or other action that is "based on" one or more of the stated conditions or values may, in practice, be based on additional conditions or values exceeding those stated.

The term "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thickness of layers and regions are enlarged for clarity. Therefore, variations in shape with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

Figure 2:
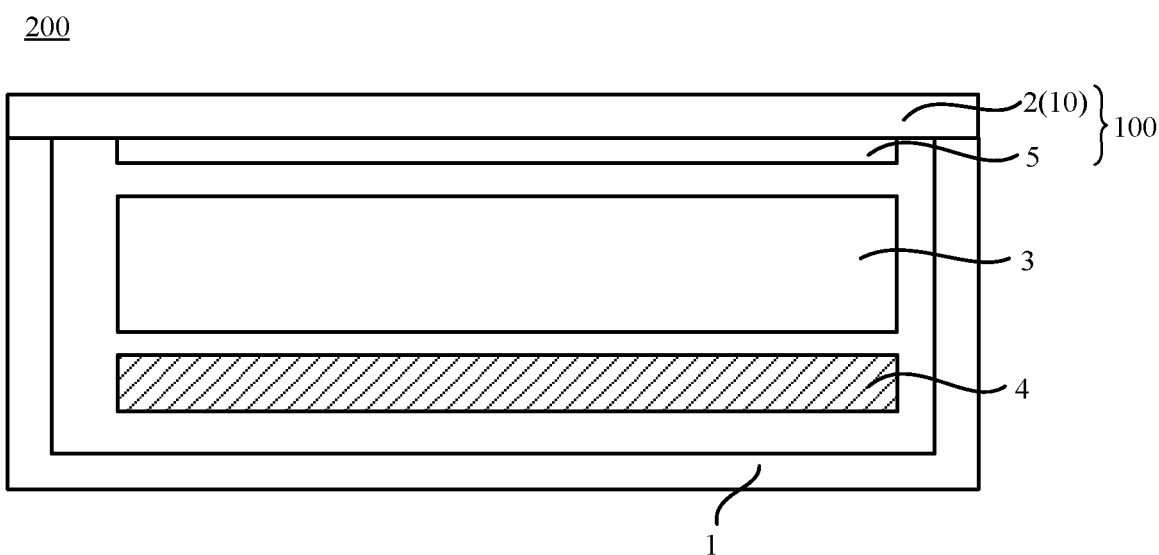
FIG. 2 is a structural diagram of another touch display apparatus, in accordance with some embodiments.

Referring to FIGS. 1 and 2, some embodiments of the present disclosure provide a touch display apparatus 200, a type of which is not limited. The touch display apparatus 200 may be a liquid crystal touch display (LCD) apparatus, or may be an electroluminescent touch display apparatus. In a case where the touch display apparatus 200 is the electroluminescent touch display apparatus, the electroluminescent touch display apparatus may be an organic light-emitting diode (OLED) touch display apparatus or a quantum dot light-emitting diode (QLED) touch display apparatus.

The touch display apparatus 200 may be any product or component having a touch function and a display function such as a display, a television, a digital camera, a mobile phone, a tablet computer or a digital photo frame.

As shown in FIGS. 1 and 2, the touch display apparatus 200 may include a housing 1, a cover plate 2, a display panel 3, a circuit board 4, a touch layer 5 and the like. In a case where the touch display apparatus 200 is the liquid crystal touch display apparatus, the touch display apparatus 200 further includes a backlight assembly. The backlight assembly is not shown in FIGS. 1 and 2.

A longitudinal section of the housing 1 is U-shaped. The display panel 3, the circuit board 4 and other accessories are all arranged in the housing 1. The circuit board 4 is disposed below the display panel 3. The cover plate 2 is disposed on a side of the display panel 3 away from the circuit board 4. In the case where the touch display apparatus 200 is the liquid crystal touch display apparatus, and the touch display apparatus includes the backlight assembly, the backlight assembly is disposed between the display panel 3 and the circuit board 4.

In some embodiments, the touch layer 5 is disposed on a light exit surface of the display panel 3, which is shown in FIG. 1. In this case, the touch layer 5 and the display panel 3 together constitute a touch panel 100. In some other embodiments, the touch layer 5 is disposed on a surface of the cover plate 2 proximate to the display panel 3, which is shown in FIG. 2. In this case, the touch layer 5 and the cover plate 2 together constitute a touch panel 100.

Figure 3:
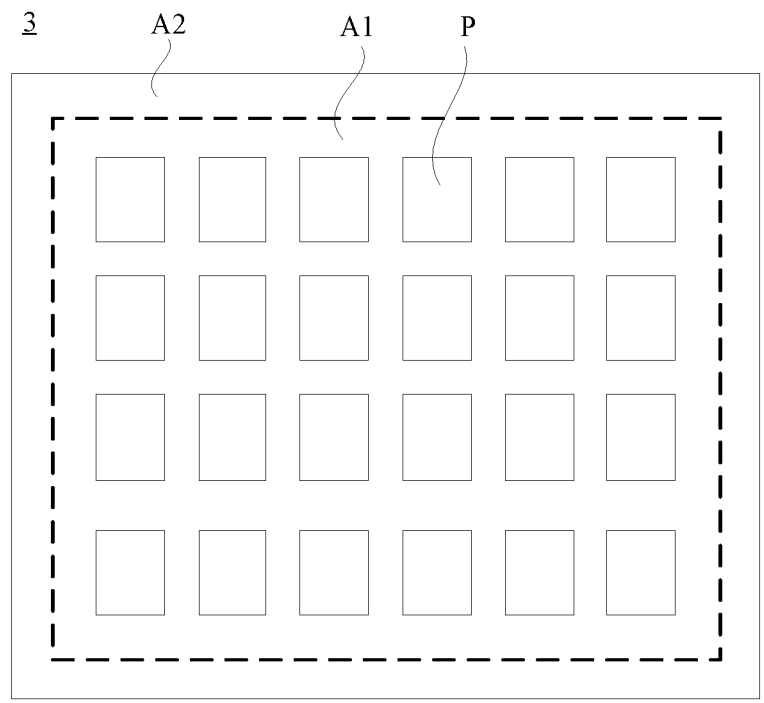
FIG. 3 is a schematic diagram showing a division of areas of a display panel, in accordance with some embodiments.

As shown in FIG. 3, the display panel 3 has a display area A1 and a peripheral area A2 located on at least one side of the display area A1. FIG. 3 illustrates an example in which the display area A1 is surrounded by the peripheral area A2. The display area A1 is provided with a plurality of sub-pixels P therein. The peripheral area A2 may be used for wiring, and furthermore, a gate driver circuit may be disposed in the peripheral area A2.

Figure 4:
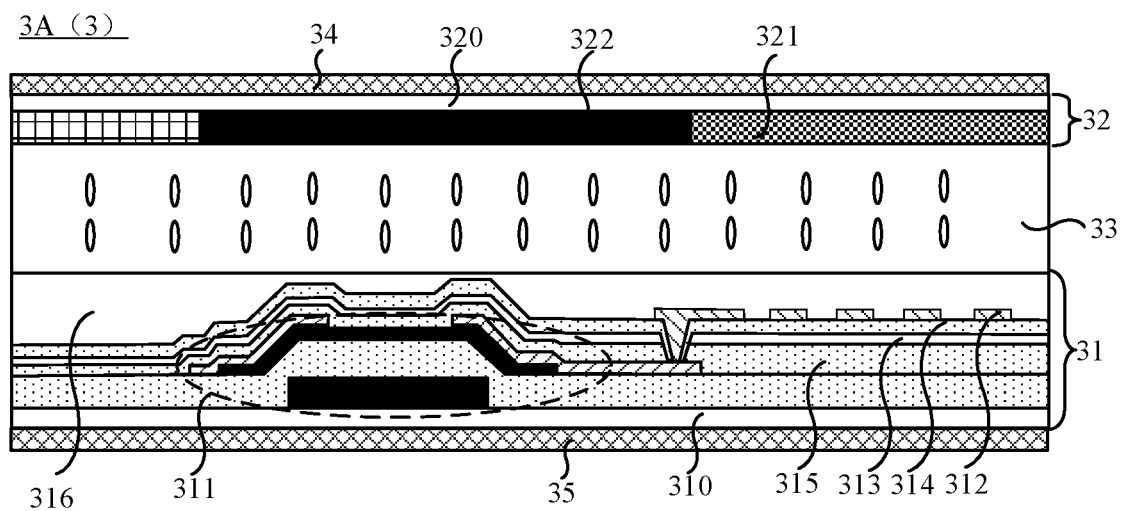
FIG. 4 is a structural diagram of a liquid crystal display panel, in accordance with some embodiments.

In the case where the touch display apparatus 200 is the liquid crystal touch display apparatus, the display panel 3 is a liquid crystal display panel. As shown in FIG. 4, a main structure of the liquid crystal display panel 3A includes an array substrate 31, an opposite substrate 32 and a liquid crystal layer 33 disposed between the array substrate 31 and the opposite substrate 32.

Each sub-pixel of the array substrate 31 includes a thin film transistor 311 and a pixel electrode 312 that are located on a first base 310. The thin film transistor 311 includes an active layer, a source, a drain, a gate, and a portion of a gate insulating layer between the gate and the active layer. The source and the drain are in contact with the active layer. The pixel electrode 312 is electrically connected to the drain of the thin film transistor 311. In some embodiments, the array substrate 31 further includes a common electrode 313 disposed on the first base 310. The pixel electrode 312 and the common electrode 313 may be disposed in a same layer. In this case, the pixel electrode 312 and the common electrode 313 are each a comb-tooth structure including a plurality of strip-shaped sub-electrodes. Alternatively, the pixel electrode 312 and the common electrode 313 may be disposed in different layers. In this case, as shown in FIG. 4, a first interlayer insulating layer 314 is provided between the pixel electrode 312 and the common electrode 313. In a case where the common electrode 313 is disposed between the thin film transistor 311 and the pixel electrode 312, as shown in FIG. 4, a second interlayer insulating layer 315 is provided between the common electrode 313 and the thin film transistor 311. In some other embodiments, the array substrate 31 does not include the common electrode 313. In this case, the common electrode 313 may be located in the opposite substrate 32.

As shown in FIG. 4, the array substrate 31 further includes a planarization layer 316 disposed on a side of the thin film transistor 311 and the pixel electrode 312 away from the first base 310.

As shown in FIG. 4, the opposite substrate 32 includes a color filter layer 321 disposed on a second base 320. In this case, the opposite substrate 32 may also be referred to as a color filter (CF) substrate. The color filter layer 321 includes at least red photoresist units, green photoresist units and blue photoresist units, and the red photoresist units, the green photoresist units and the blue photoresist units are directly opposite to the sub-pixels in the array substrate 31 in a one-to-one correspondence. The opposite substrate 32 further includes a black matrix pattern 322 disposed on the second base 320, and the black matrix pattern 322 is used for separating the red photoresist units, the green photoresist units, and the blue photoresist units.

As shown in FIG. 4, the liquid crystal display panel further includes an upper polarizer 34 disposed on a side of the opposite substrate 32 away from the liquid crystal layer 33, and a lower polarizer 35 disposed on a side of the array substrate 31 away from the liquid crystal layer 33.

Figure 5:
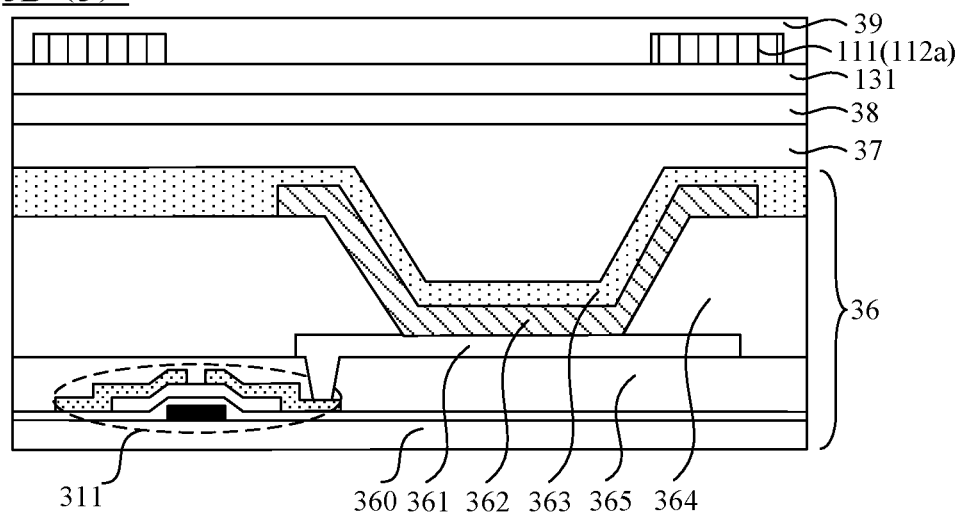
FIG. 5 is a structural diagram of an electroluminescent display panel, in accordance with some embodiments.

In the case where the touch display apparatus 200 is the electroluminescent touch display apparatus, the display panel 3 is an electroluminescent display panel. As shown in FIG. 5, the electroluminescent display panel 3B may include a display substrate 36 and an encapsulation layer 37 for encapsulating the display substrate 36. Herein, the encapsulation layer 37 may be an encapsulation film or an encapsulation substrate.

As shown in FIG. 5, each sub-pixel in the display substrate 36 includes a light-emitting device and a pixel driving circuit that are disposed on a third base 360. The pixel driving circuit includes a plurality of thin film transistors 311. The light-emitting device includes an anode 361, a light-emitting functional layer 362 and a cathode 363. The anode 361 is electrically connected to a drain of a thin film transistor 311 that serves as a driving transistor among the plurality of thin film transistors 311. The display substrate 36 further includes a pixel defining layer 364. The pixel defining layer 364 includes a plurality of opening regions, and a light-emitting device is disposed in an opening region. In some embodiments, the light-emitting functional layer 362 includes a light-emitting layer. In some other embodiments, in addition to the light-emitting layer, the light-emitting functional layer 362 further includes one or more of an electron transport layer (ETL), an electron injection layer (EIL), a hole transport layer (HTL) and a hole injection layer (HIL).

As shown in FIG. 5, the display substrate 36 further includes a planarization layer 365 disposed between the driving circuit and the anode 361.

Figure 6:
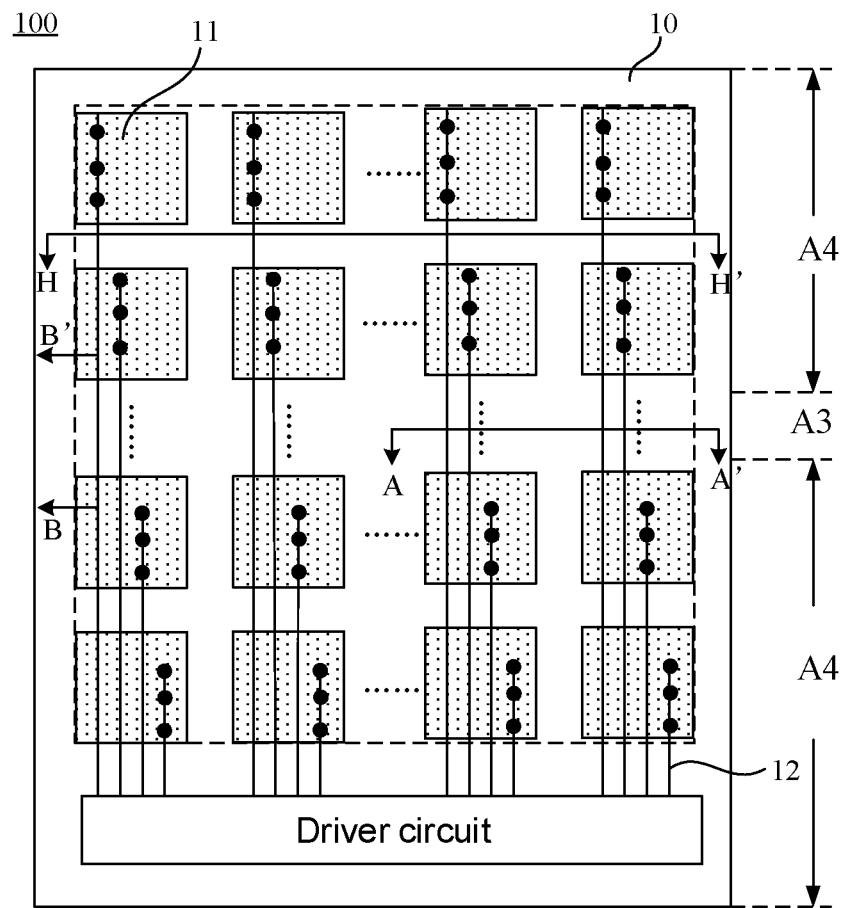
FIG. 6 is a structural diagram of a touch display panel, in accordance with some embodiments.
Figure 7:
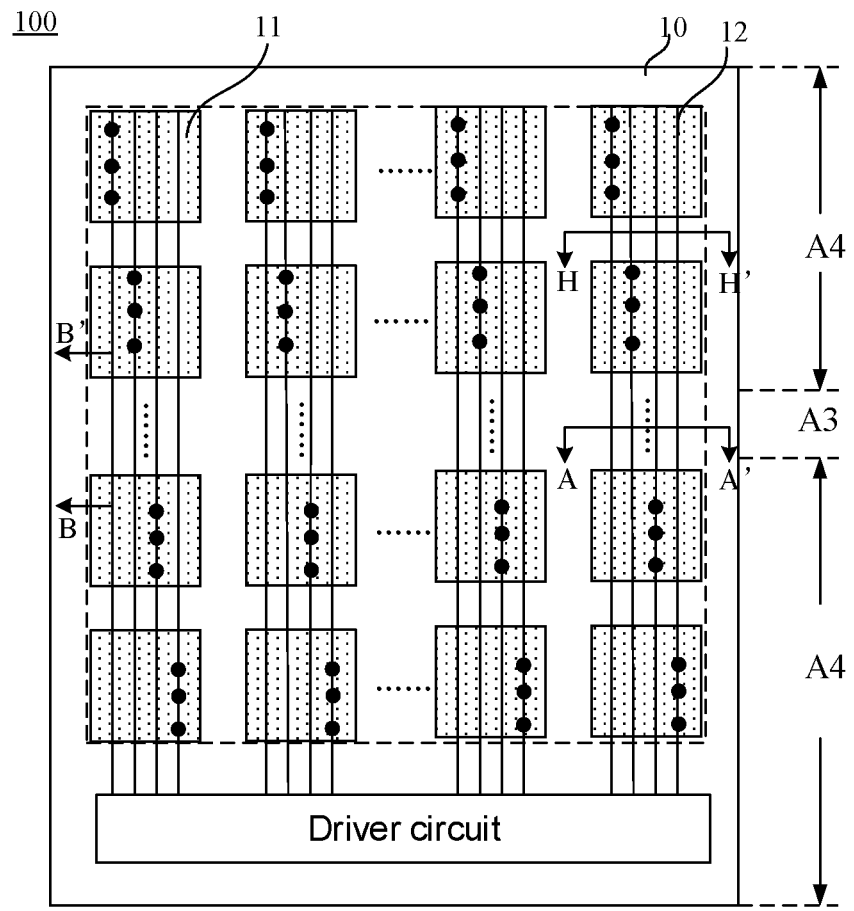
FIG. 7 is a structural diagram of another touch display panel, in accordance with some embodiments.
Figure 10:
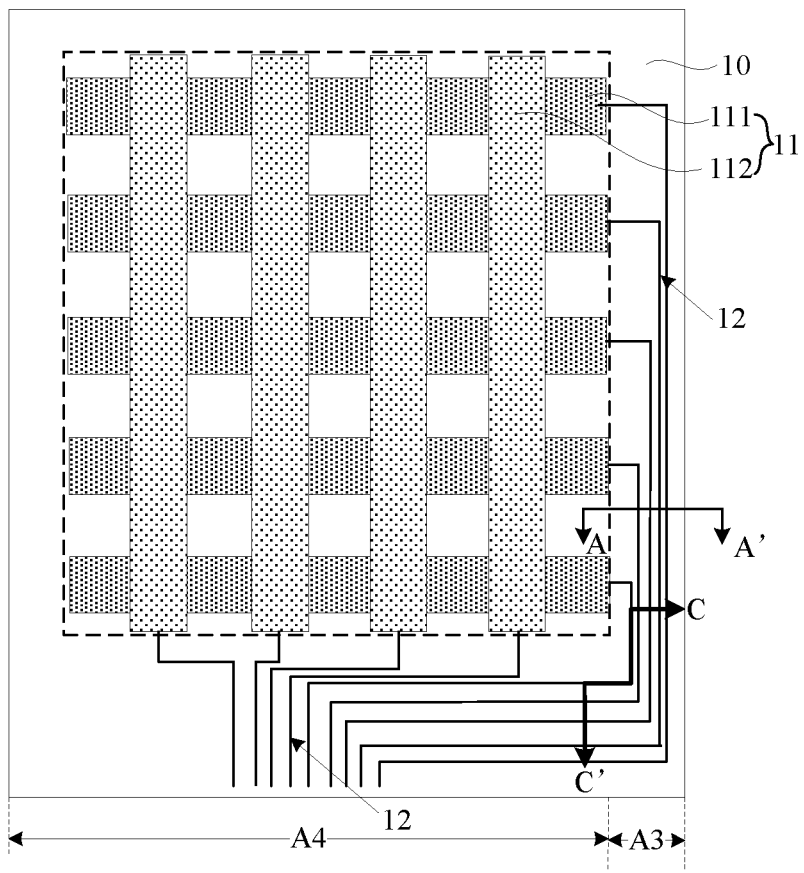
FIG. 10 is a structural diagram of yet another touch display panel, in accordance with some embodiments.

Some embodiments of the present disclosure provide a touch panel 100, which may be applied to the above touch display apparatus 200. As shown in FIGS. 6, 7 and 10, the touch panel 100 includes a carrier panel 10, a plurality of touch electrodes 11, and a plurality of touch lines 12. The carrier panel 10 has a bendable region A3 and a non-bendable region A4. The plurality of touch lines 12 and the plurality of touch electrodes 11 are all arranged on the carrier panel 10, and a touch electrode 11 is electrically connected to one or more touch lines 12 (for example, a touch electrode 11 may be electrically connected to one touch line 12; for another example, a touch electrode 11 may be electrically connected to two or more touch lines connected in parallel). A portion of at least one touch line 12 located in the bendable region A3 is a single-layer metal line, and at least a part of a portion of the at least one touch line 12 located in the non-bendable region A4 is a double-layer metal line.

It will be noted that, the term "the plurality of touch electrodes" refers to two or more touch electrodes; similarly, the term "the plurality of touch lines" refers to two or more touch lines.

Herein, the touch layer 5 includes the plurality of touch electrodes 11 and the plurality of touch lines 12. In a case where the touch layer 5 and the display panel 3 together constitute the touch panel 100, as shown in FIG. 1, the display panel 3 is the carrier panel 10, that is, the plurality of touch electrodes 11 and the plurality of touch lines 12 are arranged on the light exit surface of the display panel 3. In a case where the touch layer 5 and the cover plate 2 together constitute the touch panel 100, as shown in FIG. 2, the cover plate 2 is the carrier panel 10, that is, the plurality of touch electrodes 11 and the plurality of touch lines 12 are arranged on the surface of the cover plate 2 proximate to the display panel 3.

In addition, in the case where the plurality of touch electrodes 11 and the plurality of touch lines 12 are arranged on the light exit surface of the display panel 3, or are arranged on the surface of the cover plate 2 proximate to the display panel 2, other film layers are further provided around the plurality of touch electrodes 11 and the plurality of touch lines 12. These film layers may include, for example, a protective layer to prevent the plurality of touch electrodes 11 and the plurality of touch lines 12 from being corroded by external environment, or a film layer in the display panel 3 proximate to the plurality of touch electrodes 11 and the plurality of touch lines 12.

It will be noted that, the touch panel 100 may have a touch area and a wiring area. Based on this, the touch area corresponds to the display area A1, and the wiring area corresponds to the peripheral area A2. In some embodiments, as shown in FIGS. 6 and 7, the plurality of touch electrodes 11 are located in the touch area (e.g., an area inside the dotted box shown in FIGS. 6 and 7). The plurality of touch lines 12 may be located in the touch area, and may also be located in the wiring area (e.g., an area outside the dotted box shown in FIGS. 6 and 7). In some other embodiments, as shown in FIG. 10, the plurality of touch electrodes 11 are only located in the touch area (e.g., an area inside the dotted box shown in FIG. 10), and the plurality of touch lines 12 are only located in the wiring area (e.g., an area outside the dotted box shown in FIG. 10).

In some embodiments, the bendable region A3 is located in the middle or an edge of the touch panel 100. It will be noted that, the "middle" may be understood as any region except for edges of the touch panel 100, and is not limited to a middle position of the touch panel 100 in a certain direction.

Figure 8A:
FIG. 8A is a sectional view taken along the line A-A' in FIG. 6 (or FIG. 7)
Figure 8B:
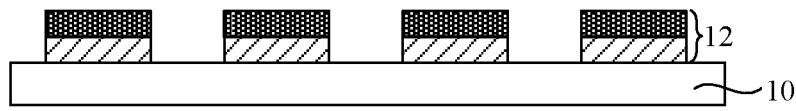
FIG. 8B is a sectional view taken along the line H-H' in FIG. 6 (or FIGS. 7)
Figure 8C:
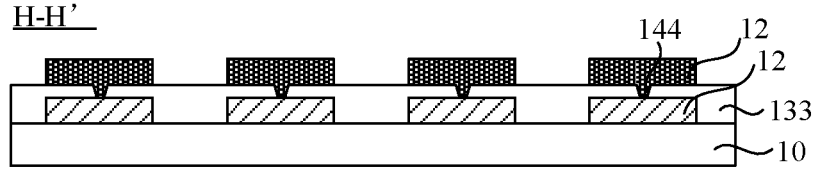
FIG. 8C is a sectional view taken along the line H-H' in FIG. 6 (or FIG. 7) in a case where a third insulating layer is provided.

In some embodiments, as shown in FIGS. 6 and 7, the bendable region A3 is located in the middle of the touch panel 100. FIG. 8A is a sectional view taken along the line A-A' in FIG. 6 (or FIG. 7), FIG. 8B is a sectional view taken along the line H-H' in FIG. 6 (or FIG. 7), and FIG. 8C is a sectional view taken along the line A-A' in FIG. 6 (or FIG. 7) in a case where a third insulating layer is provided. Portions of the plurality of touch lines 12 located in the bendable region A3 are single-layer metal lines, and a structure of the single-layer metal lines may be shown in FIG. 8A. Portions of the plurality of touch lines 12 located in the non-bendable region A4 are double-layer metal lines, and a structure of the double-layer metal lines may be shown in FIGS. 8B and 8C. In the structure shown in FIG. 8B, metal lines in two layers are in direct contact to form a structure of a double-layer metal line. However, in the structure shown in FIG. 8C, metal lines in two layers are electrically connected together through a fourth via hole 144 in the third insulating layer 133 between the two layers of the metal lines to form a structure of a double-layer metal line. For example, orthogonal projections of the metal lines of the double-layer metal line on the carrier panel 10 substantially overlap.

Figure 9A:
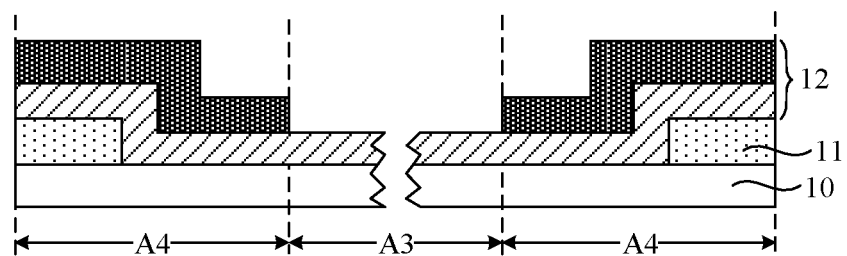
FIG. 9A is a sectional view taken along the line B-B' in FIG. 6 (or FIG. 7)
Figure 9B:
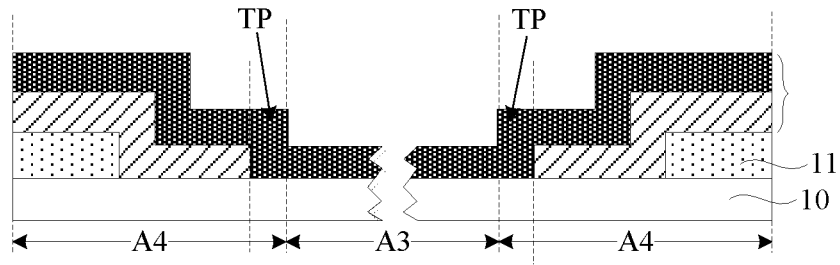
FIG. 9B is another sectional view taken along the line B-B' in FIG. 6 (or FIG. 7)

Based on this, FIG. 9A is a sectional view taken along the line B-B' in FIG. 6 (or FIG. 7), and FIG. 9B is another sectional view taken along the line B-B' in FIG. 6 (or FIG. 7). FIG. 9B shows a transition portion TP between a single-layer metal line of each of the plurality of touch lines 12 located in the bendable region A3 and double-layer metal lines thereof located in the non-bendable regions A4. In addition, referring to FIG. 9A, the single-layer metal line of each of the plurality of touch lines 12 located in the bendable region A3 may be disposed in a same layer as a lower metal line of the double-layer metal line of the touch line 12 located in the non-bendable region A4. Referring to FIG. 9B, the single-layer metal line of each of the plurality of touch lines 12 located in the bendable region A3 may be disposed in a same layer as an upper metal line of the double-layer metal line of the touch line 12 located in the non-bendable region A4.

Figure 9C:
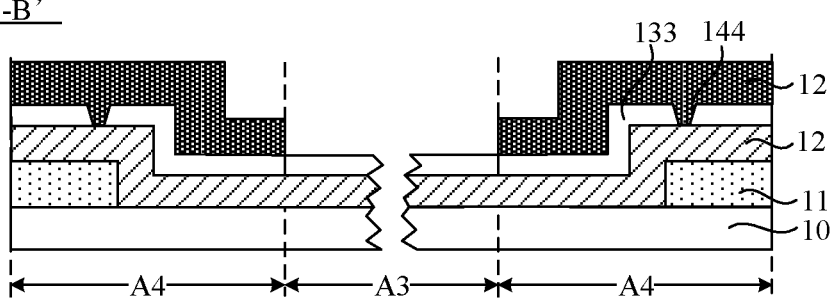
FIG. 9C is a sectional view taken along the line B-B' in FIG. 6 (or FIG. 7) in a case where a third insulating layer is provided.
Figure 9D:
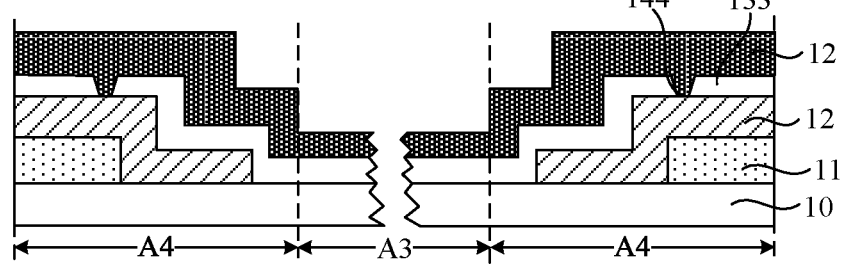
FIG. 9D is another sectional view taken along the line B-B' in FIG. 6 (or FIG. 7) in a case where a third insulating layer is provided.

Furthermore, in the non-bendable region A4, referring to FIGS. 9A and 9B, metal lines in two layers may in direct contact to form a structure of a double-layer metal line. Alternatively, referring to FIGS. 9C and 9D, in the case where the third insulating layer 133 is provided, the metal lines in the two layers may be electrically connected through a fourth via hole 144 in the third insulating layer 133, between the two layers of the metal lines, to form a structure of a double-layer metal line. In addition, in the case where the third insulating layer 133 is provided, for a location arrangement of a layer where the single-layer metal line located in the bendable region A3 is located, relative to the double-layer metal line in the non-bendable region A4, in FIGS. 9C and 9D, reference may be made to the description of FIGS. 9A and 9B, and details will not be repeated herein.

Figure 11A:
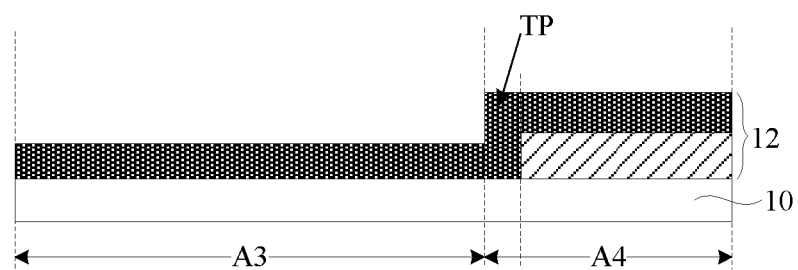
FIG. 11A is a sectional view taken along the line C-C' in FIG. 10.
Figure 11B:
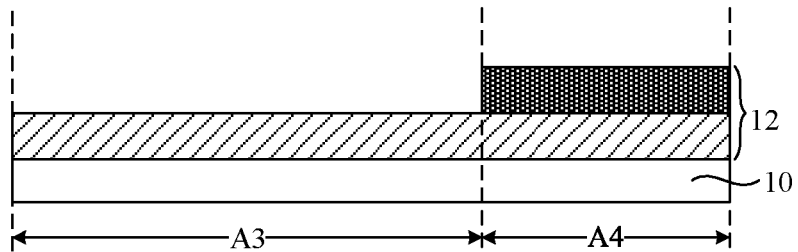
FIG. 11B is another sectional view taken along the line C-C' in FIG. 10.

In some other embodiments, as shown in FIG. 10, the bendable region A3 is located at an edge of the touch panel 100. FIG. 8A may also be regarded as sectional views taken along the line A-A' in FIG. 10. Portions of the plurality of touch lines 12 located in the bendable region A3 are single-layer metal lines, and the structure of the single-layer metal line is shown in FIG. 8A. Portions of the plurality of touch lines 12 located in the non-bendable region A4 are double-layer metal lines, and the structure of the double-layer metal line is shown in FIG. 8B. Based on this, FIG. 11A is a sectional view taken along the line C-C' in FIG. 10, and FIG. 11B is another sectional view taken along the line C-C' in FIG. 10. FIG. 11A shows a transition portion TP between the single-layer metal line of each of the plurality of touch lines 12 located in the bendable region A3 and the double-layer metal line thereof located in the non-bendable region A4. In addition, referring to FIG. 11A, the single-layer metal line of each of the plurality of touch lines 12 located in the bendable region A3 may be disposed in a same layer as an upper metal line of the double-layer metal line of the touch line 12 located in the non-bendable region A4. Referring to FIG. 11B, the single-layer metal line of each of the plurality of touch lines 12 located in the bendable region A3 may be disposed in a same layer as a lower metal line of the double-layer metal line of the touch line 12 located in the non-bendable region A4.

Figure 11C:
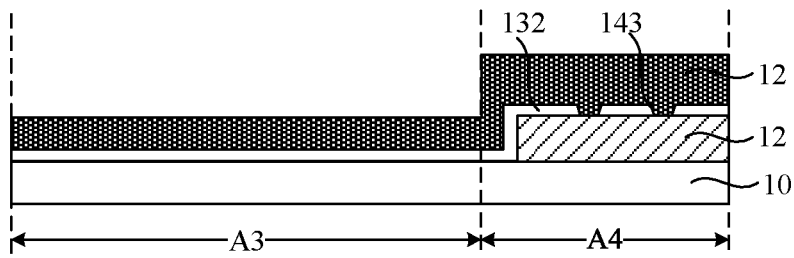
FIG. 11C is a sectional view taken along the line C-C' in FIG. 10 in a case where a second insulating layer is provided.
Figure 11D:
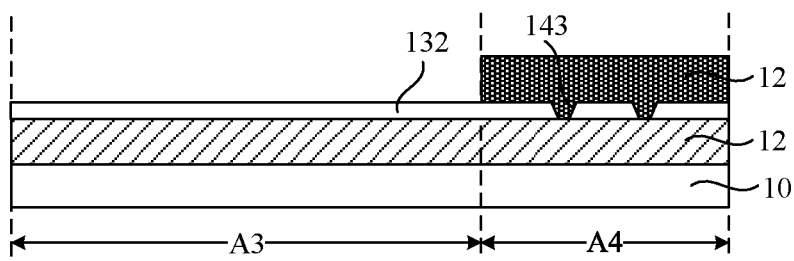
FIG. 11D is another sectional view taken along the line C-C' in FIG. 10 in a case where a second insulating layer is provided.

Furthermore, in the non-bendable region A4, referring to FIGS. 11A and 11B, metal lines in two layers may in direct contact to form a structure of a double-layer metal line. Alternatively, referring to FIGS. 11C and 11D, in the case where a second insulating layer 132 is provided, the metal lines in the two layers may be electrically connected through third via holes 143 in the second insulating layer 132 between the two layers of the metal lines to form a structure of a double-layer metal line. In addition, in the case where the second insulating layer 132 is provided, for a location arrangement of a layer where the single-layer metal line located in the bendable region A3 is located, relative to the double-layer metal line in the non-bendable region A4, in FIGS. 11C and 11D, reference may be made to the description of FIG. 11A and FIG. 11B, and details will not be repeated herein.

It will be noted that, the "upper" and "lower" in the embodiments of the present disclosure are only descriptions with reference to an orientation of the corresponding drawings (e.g., FIGS. 9A, 9B, 11A, and 11B), and are not used as a limitation.

It will be noted that in the examples of FIGS. 6 and 7, an insulating layer (e.g., the third insulating layer 133) may further be provided between the touch electrodes 11 and the touch lines 12. In this case, a touch line 12 may be electrically connected to a touch electrode 11 through via holes in the insulating layer.

Figure 12:
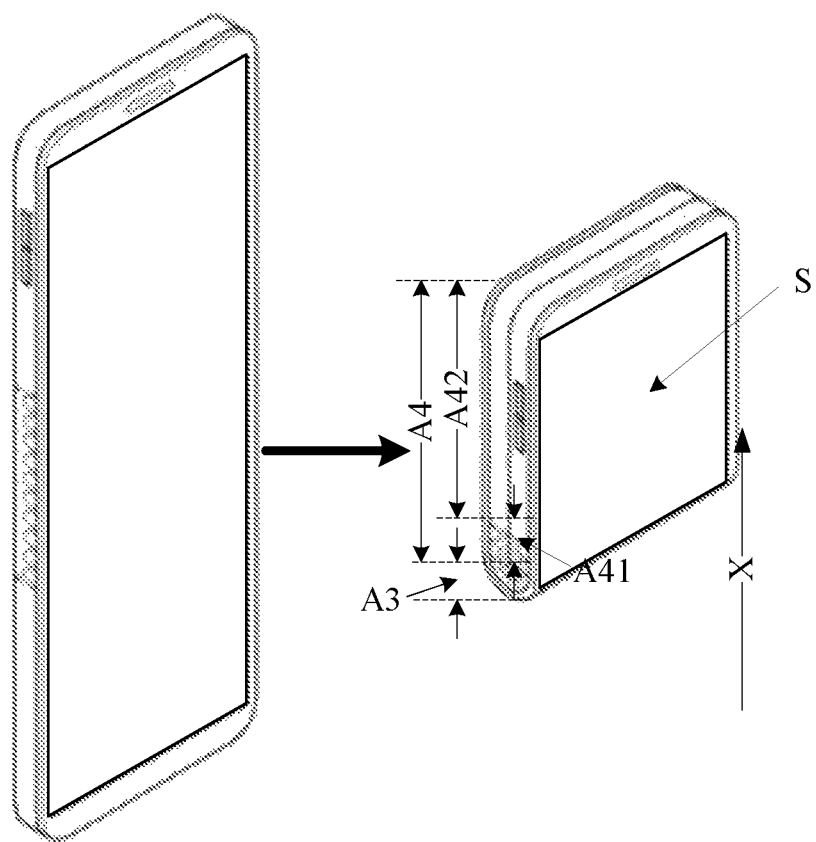
FIG. 12 is a structural diagram of a touch display apparatus in which a bendable region is located in the middle, in accordance with some embodiments.

When the above touch panel 100 is applied to some actual scenes, in some examples, as shown in FIG. 12, the bendable region A3 is located in the middle of the touch panel 100. In this case, referring to FIGS. 6 and 7, it may be seen that, portions of the plurality of touch lines 12 in the bendable region A3 are also located in the touch area. In this case, in the touch lines 12 located in the middle of the touch panel 100, portions of touch lines 12 located in the bendable region A3 are single-layer metal lines, and at least a portion of at least some of touch lines 12 located in the non-bendable region A4 are double-layer metal lines. In this case, referring to FIG. 12, the non-bendable region A4 includes a partial region proximate to the bendable region A3, which is an adjacent region A41 in the non-bendable region A4, and the remaining region in the non-bendable region A4 is a non-adjacent region A42. Portions of touch lines 12 in the adjacent region A41 may be the same as the portions of the touch lines 12 in the bendable region A3, each of which is a single-layer metal line. In this case, portions of touch lines 12 in the non-adjacent region A42 are double-layer metal lines. In some other examples, the portions of the touch lines 12 in the adjacent region A41 may be the same as the portions of the touch lines 12 in the non-adjacent region A42, each of which is a double metal line. In this case, the portions of the touch lines 12 in the bendable region A3 are still the single-layer metal lines.

Figure 13:
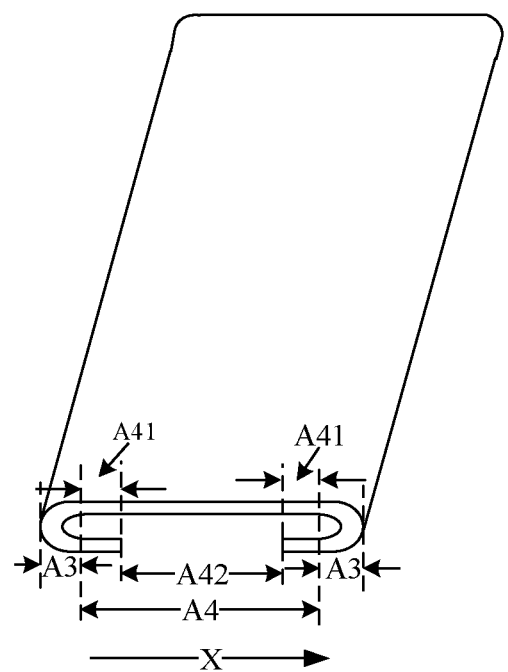
FIG. 13 is a structural diagram of a touch display apparatus in which bendable regions are located at edges, in accordance with some embodiments.

In some other examples, as shown in FIG. 13, the bendable region A3 is located at edges of the touch panel 100, referring to FIG. 10, it may be seen that, portions of touch lines 12 in the bendable region A3 are also located in the wiring area. In this case, in the touch lines 12 located at the edges of the touch panel 100, portions of touch lines 12 located in the bendable region A3 are single-layer metal lines, and at least a portion of at least some touch lines 12 located in the non-bendable region A4 are double-layer metal lines. In this case, referring to FIG. 13, the non-bendable region A4 includes a partial region proximate to the bendable region A3, which is an adjacent region A41 in the non-bendable region A4, and the remaining region in the non-bendable region A4 is a non-adjacent region A42. Portions of touch lines 12 in the adjacent region A41 may be the same as the portions of the touch lines 12 in the bendable region A3, each of which is a single-layer metal line. In this case, portions of touch lines 12 in the non-adjacent region A42 are double-layer metal lines. Alternatively, the portions of the touch lines 12 in the adjacent region A41 may be the same as the portions of the touch lines 12 in the non-adjacent region A42, each of which is a double-layer metal line. In this case, the portions of the touch lines 12 in the bendable region A3 are still single-layer metal lines.

Herein, the at least a part of the portions of the plurality of touch lines 12 located in the non-bendable region A4 are double-layer metal lines. That is, a part of the portions of the plurality of touch lines 12 located in the non-bendable region A4 may be double-layer metal lines, or all of the portions of the plurality of touch lines 12 located in the non-bendable region A4 may be double-layer metal lines.

It will be noted that, the above non-bendable region A4 may be provided at one side of the bendable region A3, or may be provided at two sides of the bendable region A3. In a case where non-bendable regions A4 are provided at two sides of the bendable region A3, the two non-bendable regions A4 may each include the adjacent region A41 and the non-adjacent region A42, or one non-bendable region A4 may include the adjacent region A41 and the non-adjacent region A42, and the other non-bendable region A4 may only include the adjacent region A41.

A touch panel provided by the related art includes a carrier panel, a plurality of touch electrodes, and a plurality of touch lines. The carrier panel has a bendable region and a non-bendable region. The touch electrodes and the touch lines are arranged on the carrier panel and are electrically connected to each other. Portions of the plurality of touch lines located in the bendable region and the non-bendable region are all double-layer metal lines. Since the portions of the plurality of touch lines located in the bendable region and the non-bendable region of the plurality touch lines in the touch panel provided by the related art are all the double-layer metal lines, and a thickness of the double-layer metal lines is large, a film layer around the touch lines is uneven. Therefore, when the touch panel is bent, cracks are easily generated in the film layer around the touch lines in the bendable region.

Based on this, some embodiments of the present disclosure provide a touch panel 100. The touch panel 100 includes a carrier panel 10, a plurality of touch electrodes 11, and a plurality of touch lines 12. The carrier panel 10 has a bendable region A3 and a non-bendable region A4. The plurality of touch lines 12 and the plurality of touch electrodes 11 are all arranged on the carrier panel 10, and a touch electrode 11 is electrically connected to one or more touch lines 12. A portion of at least one touch line 12 located in the bendable region A3 is a single-layer metal line, and at least a part of a portion of the at least one touch line 12 located in the non-bendable region A4 is a double-layer metal line. Since in the touch panel 100 provided by some embodiments of the present disclosure, portion(s) of the plurality of touch lines 12 located in the bendable region A3 are single-layer metal line(s), and a thickness of the single-layer metal line(s) is small, it may not cause an uneven thickness of a film layer around the single-layer metal line(s). Therefore, when the touch panel 100 is bent, the film layer around the bendable region A3 is smooth, thereby reducing a risk of cracks in the film layer in the bendable region A3. Based on this, since at least a part of portion(s) of the plurality of touch lines 12 located in the non-bendable region A4 is a double-layer metal line, and two metal lines in the double-layer metal line are connected in parallel, a sectional area of a touch line 12 is increased. Therefore, the double-layer metal line in the non-bendable region A4 may reduce the impedance of the touch line 12.

For example, as shown in FIGS. 12 and 13, a dimension (length) of adjacent regions A41 in a first direction X is less than a dimension (length) of a non-adjacent region A42 in the first direction X. The first direction is parallel to a surface S, provided with the plurality of touch electrodes and the plurality of touch lines thereon, of the carrier panel 10 and perpendicular to boundary(s) of the bendable region(s) A3 proximate to the adjacent regions A41. In this way, an area of the non-adjacent region A42 may be increased, which is helpful for increasing a length of the double-layer metal line in the non-bendable region A4 and reducing the impedance of the touch line 12. Furthermore, by providing portion(s) of touch line(s) in the adjacent regions A41 proximate to the bendable region A3 as single-layer metal lines, it is also possible to reduce the risk that a film layer in the bendable region A3 is easily cracked due to that the film layer in the bendable region A3 is not uniform with a film layer around the bendable region A3. As a result, it is helpful for further improving the stability and reliability of the touch panel 100 during bending and use.

For some other examples, all portions of the plurality of touch lines 12 located in the non-bendable region A4 are all double-layer metal lines. Since all the portions of the plurality of touch lines 12 located in the non-bendable region A4 are the double-layer metal lines, the impedance of the touch lines 12 may be further reduced while the risk of cracks of the film layer around the single-layer metal lines in the bendable region A3 is reduced.

In some embodiments, as shown in FIGS. 6 and 7, the plurality of touch electrodes 11 are arranged in an array, and each touch line 12 is electrically connected to a touch electrode 11.

In the plurality of touch electrodes 11 arranged in an array, as shown in FIG. 6, each touch line 12 is connected to a touch electrode 11 and extends to be electrically connected to a driver circuit. Alternatively, as shown in FIG. 7, each touch line 12 is connected to a touch electrode 11, and extends to be electrically connected to a driver circuit from an end of the touch area of the touch panel 100 away from the driver circuit. It may be understood that, in this case, the length of each touch line 12 is equal or approximately equal, and each touch line 12 is connected to only one touch electrode 11. In the plurality of touch electrodes 11 arranged in the array, an original capacitance will exist between each touch electrode 11 and a ground terminal (GND). When a conductor (e.g., a finger) touches a region of the touch panel 100 where the touch electrode 11 is located, the original capacitance in the region will be changed, and a position of a touch point may be obtained by detecting the change of the capacitance. Since the length of each touch line 12 is approximately equal, original capacitances existed between the touch electrodes 11 connected to the touch lines 12 and the ground may be uniform in magnitude, which helps to make the touch sensitivity of positions of the touch panel 100 uniform.

Figure 14:
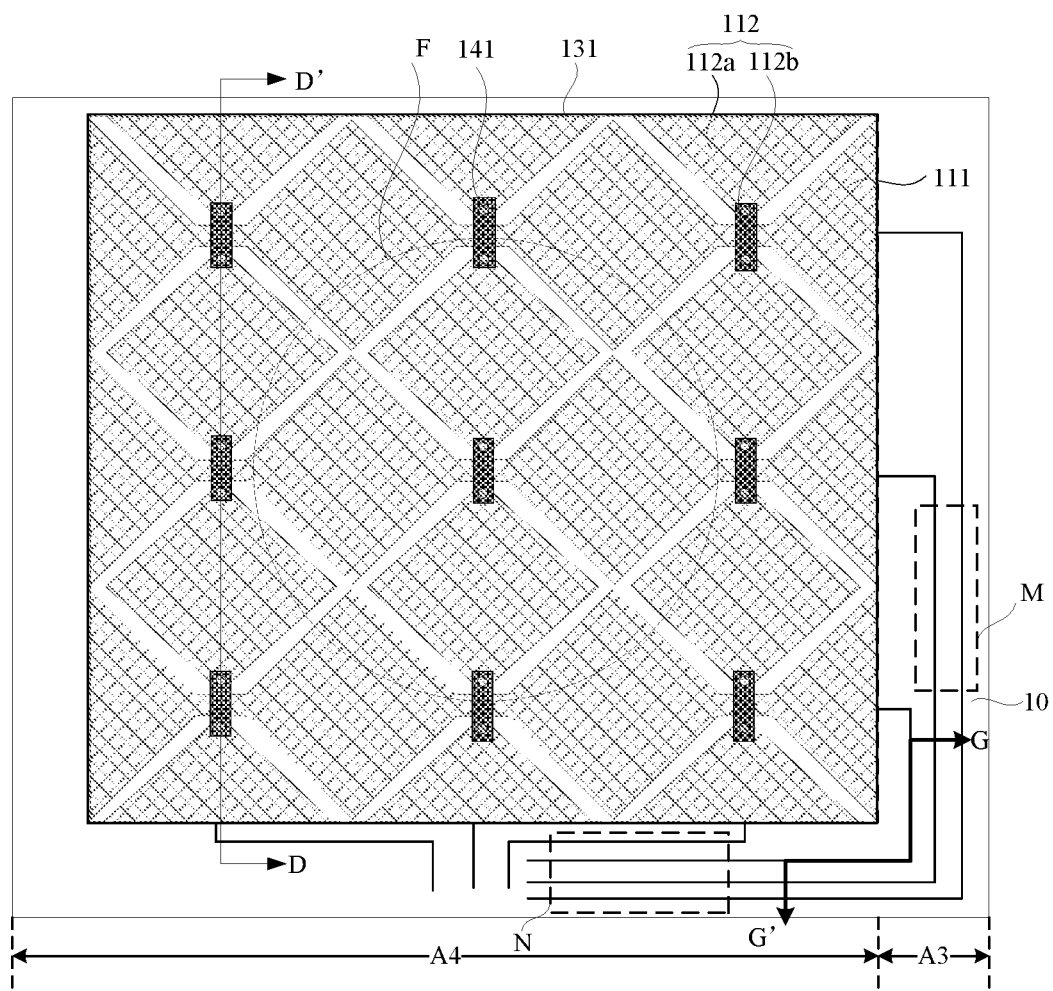
FIG. 14 is a structural diagram of yet another touch panel, in accordance with some embodiments.

In some other examples, as shown in FIGS. 10 and 14, the plurality of touch electrodes 11 include a plurality of first touch electrodes 111 and a plurality of second touch electrodes 112. The plurality of first touch electrodes 111 and the plurality of second touch electrodes 112 are arranged crosswise and are insulated from each other.

A shape and number of the first touch electrodes 111, and a shape and number of the second touch electrodes 112 are not limited. A corresponding shape of each first touch electrode 111, a corresponding shape of each second touch electrode 112, a corresponding number of the first touch electrodes 111 and a corresponding number of the second touch electrodes 112 may be selected according to actual needs, as long as a position of a touch point may be determined by detecting a capacitance.

For example, as shown in FIG. 10, the first touch electrodes 111 and the second touch electrodes 112 are each strip-shaped. In this case, there are cross regions between the first touch electrodes 111 and the second touch electrodes 112, that is, there is a certain overlapping area between orthogonal projections of the first touch electrodes 111 on the carrier panel and orthogonal projections of the second touch electrodes on the carrier panel. The first touch electrodes 111 and the second touch electrodes 112 are insulated from each other. For example, the second insulating layer 132 (e.g., the second insulating layer 132 shown in FIGS. 11C and 11D) may be provided between the first touch electrodes 111 and the second touch electrodes 112, and the first touch electrodes 111 are insulated from the second touch electrodes 112 by the second insulating layer 132. Therefore, an original capacitance will exist in a region where a first touch electrode 111 crosses a second touch electrode. In a case where a conductor (e.g., a finger) touches the cross region, the original capacitance in the region will be changed, and a position of a touch point may be obtained by detecting the change of the capacitance.

In some embodiments, as shown in FIG. 14, the first touch electrode 111 is a whole electrode, and the second touch electrode 112 includes a plurality of touch sub-electrodes 112a separated by the plurality of first touch electrodes 111 and a plurality of connection portion 112b. The touch panel 100 further includes a first insulating layer 131, and the first insulating layer 131 has a plurality of first via holes 141. The first touch electrodes 111 and the touch sub-electrodes 112a are arranged in a same layer, and the first touch electrodes 111 and the connection portions 112b are located on both sides of the first insulating layer 131.

Referring to FIG. 5, the first touch electrodes 111 and the touch sub-electrodes 112a are arranged on a light exit side of the display substrate 36. In this case, the connection portions 112b may be arranged on a side of the first touch electrodes 111 proximate to or away from the display substrate 36. In a case where the connection portions 112b are provided on the side of the first touch electrodes 111 proximate to the display substrate 36, the first insulating layer 131 is provided between the connection portions 112b and all of the first touch electrodes 111 and the touch sub-electrodes 112a. Based on this, referring to FIG. 5, the display panel 3 may further include a protective layer 39 for protecting the first touch electrodes 111 and the touch sub-electrodes 112a.

In order to prevent the encapsulation layer 37 from being damaged and scratched when the touch electrodes 11 are formed, in some embodiments, as shown in FIG. 5, the display panel 3 further includes a buffer layer 38 disposed on the encapsulation layer 37.

Herein, the first touch electrodes 111 may be touch transmitting electrodes (Tx), and the second touch electrodes 112 may be touch receiving electrodes (Rx). Alternately, the first touch electrodes 111 may be receiving electrodes (Rx), and the second touch electrodes 112 may be transmitting electrodes (Tx). The embodiments of the present disclosure do not limit thereto.

Based on this, in a case where the first touch electrodes 111 are touch transmitting electrodes (Tx) and the second touch electrodes 112 are touch receiving electrodes (Rx), as shown in FIG. 14, a touch transmitting electrode (Tx) is a whole electrode, and a touch receiving electrode (Rx) includes a plurality of touch sub-electrodes 112a and a plurality of connection portions 112b. Two adjacent touch sub-electrodes 112a of the touch receiving electrode (Rx) are separated by a touch transmitting electrode (Tx). In a case where the first touch electrodes 111 are touch receiving electrodes (Rx) and the second touch electrodes 112 are touch transmitting electrodes (Tx), as shown in FIG. 14, a touch receiving electrodes (Rx) is a whole electrode, and a touch transmitting electrode (Tx) includes a plurality of touch sub-electrodes 112a and a plurality of connection portions 112b. Two adjacent touch sub-electrodes 112a of the touch transmitting electrode (Tx) are separated by a touch receiving electrode (Rx).

It will be noted that, each first touch electrode 111 being of an integrated structure means that respective portions of the first touch electrode 111 are located in a same layer and are directly connected together.

In addition, "same layer" refers to a layer structure formed by a same patterning process by using a same mask in which a film layer for forming specific patterns is formed by using a same film-forming process. Depending on different specific patterns, the same patterning process may include exposure, development and etching, and the specific patterns formed in the layer structure may be continuous or discontinuous, and these specific patterns may also be at different heights or have different thicknesses.

In some embodiments of the present disclosure, referring to FIG. 14, since each first touch electrode 21 is a whole electrode, and all of the touch sub-electrodes 112a and all of the first touch electrodes 21 are located in the same layer, two adjacent touch sub-electrodes 112a, separated by a first touch electrode 111, in each second touch electrode 112 are connected by a connection portion 112b through first via holes 141 in the first insulating layer 131. That is, each connection portion 112b and a first touch electrode 21 are arranged crosswise, so as to achieve an electrical connection among respective touch sub-electrodes 112a in each second touch electrode 112.

Figure 15:
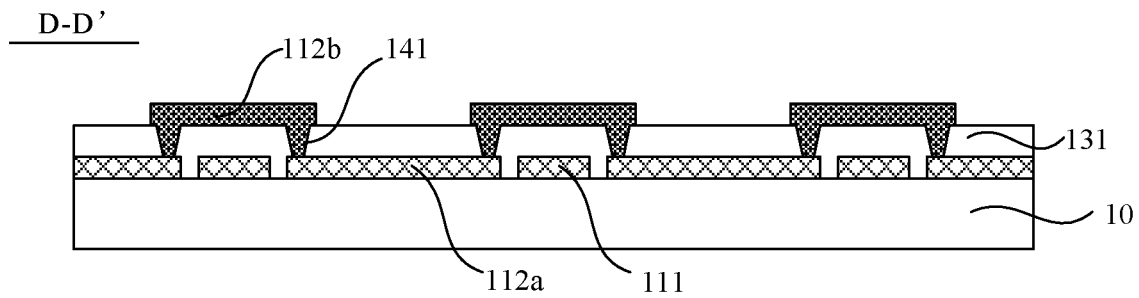
FIG. 15 is a sectional view taken along the line D-D' in FIG. 14.

In some embodiments, as shown in FIG. 15 (FIG. 15 being a sectional view taken along the line D-D' in FIG. 14), two adjacent touch sub-electrodes 112a in the second touch electrodes 112 are electrically connected to the connection portion 112b through at least two first via holes 141 in the first insulating layer 131.

Since the two adjacent touch sub-electrodes 112a separated by the first touch electrode 111 are connected by the at least two first via holes 141 in the first insulating layer 131, there is a cross region between the first touch electrode 111 and the connection portion 112b. Moreover, since the first touch electrode 111 and the connection portion 112b are insulated from each other, an original capacitance exist in the region where the first touch electrode 111 crosses the connection portion 112b. When the cross region is touched by a conductor (e.g., a finger), the original capacitance in the region may be changed, and a position of a touch point may be obtained by detecting the change of the capacitance.

Herein, the first touch electrodes 111 and the touch sub-electrodes 112a are arranged in the same layer, and the first touch electrodes 111 and the connection portions 112b are located on both sides of the first insulating layer 131. It may be that the first touch electrodes 111 and the touch sub-electrodes 112a are disposed on a side of the first insulating layer 131 proximate to the carrier panel 10, and the connection portions 112b are disposed on a side of the first insulating layer 131 away from the carrier panel 10; alternatively, it may be that the first touch electrodes 111 and the touch sub-electrodes 112a are disposed on the side of the first insulating layer 131 away from the carrier panel 10, and the connection portions 112b are disposed on the side of the first insulating layer 131 proximate to the carrier panel 10. The embodiments of the present disclosure are not limited thereto.

An arrangement of the first insulating layer 131 is not limited. The first insulating layer 131 may be provided as a whole layer, or there may be a plurality of first insulating layers 131. In a case where there are the plurality of first insulating layers 131, the first insulating layers 131 are only provided in the regions where the first touch electrodes 111 cross the connection portions 112b. In a case where the first insulating layer 131 is the whole layer, for example, orthogonal projections of the first touch electrodes 111 and the touch sub-electrodes 112a on the first insulating layer 131 are within a boundary of the first insulating layer 131, and the first insulating layer 131 is only provided in the touch area of the touch panel 100.

In some embodiments, at least a portion of the at least one touch electrode 11 has a metal mesh structure.

Figure 16:
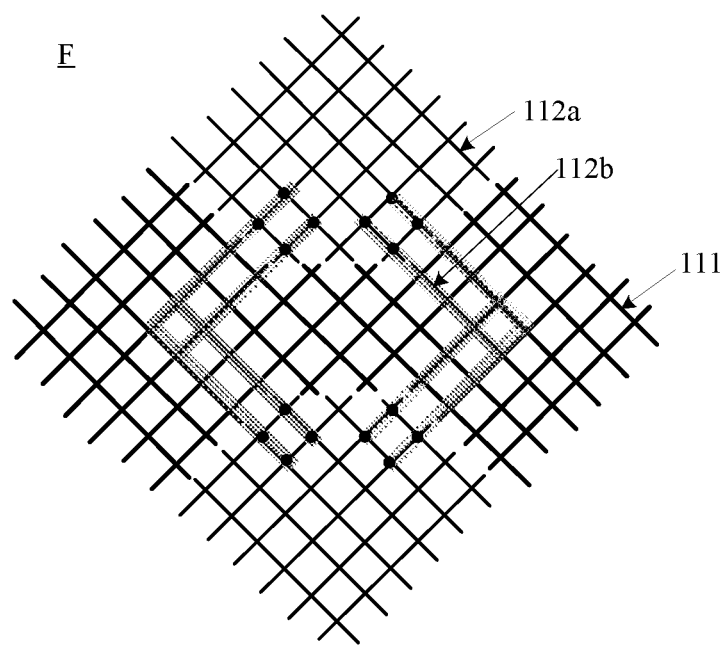
FIG. 16 is a partial enlargement view of the part F in FIG. 14.

For example, as shown in FIGS. 14 and 16, the first touch electrodes 111 and the touch sub-electrodes 112a each have a metal mesh structure.

Herein, FIG. 16 is a partial enlargement view of the region F in FIG. 14;

In a case where the first touch electrodes 111 and the touch sub-electrodes 112a each have the metal mesh structure, a metal material of the metal mesh is not limited. The metal material may be simple metal or metal alloy, for example, the metal material may be one of silver (Ag), copper (Cu), aluminum (Al), or aluminum niobium alloy (AlNb). Alternatively, the metal material may be a metal layer in which a plurality of (at least two) metal sub-layers are stacked. For example, the metal layer includes three metal sub-layers, a material of a metal sub-layer in the middle is Al, and a material of metal sub-layers located on opposite sides of the middle layer is titanium (Ti), and this structure may be denoted as Ti/Al/Ti. In the case where the portion of the touch line 12 located in the bendable region A3 is the single-layer metal line, the single-layer metal line may include a plurality of metal sub-layers, and has the Ti/Al/Ti structure. For example, the single-layer metal line may be arranged in the same layer as the first touch electrodes 111 and the touch sub-electrodes 112a, alternatively may be arranged in the same layer as the connection portions 112b. In the case where the portion of the touch line located in the non-bendable region A4 is the double-layer metal line, one layer of the double-layer metal line may be arranged in the same layer as the first touch electrodes 111 and the touch sub-electrodes 112a, and has the Ti/Al/Ti structure, and the other layer may be arranged in the same layer as the connection portions 112b, and also has the Ti/Al/Ti structure.

In the example, the first touch electrodes 111 and the touch sub-electrodes 112a each have the metal mesh structure, so that a light transmittance of the entire touch panel 100 may be good; and in addition, since a conductivity of the metal material is generally low, compared with a transparent conductive material such as indium tin oxide (ITO), an overall conductivity of each first touch electrode 111 and each second touch electrode 112 made of the metal material is good.

It will be understood that, since the first touch electrodes 111 and the touch sub-electrodes 112a are arranged in the same layer, referring to FIGS. 14 and 16, a first touch electrode 111 and a touch sub-electrode 112a adjacent thereto are disconnected.

In addition, shapes of the first touch electrodes 111 and the touch sub-electrodes 112a having the metal mesh structure are not limited. For example, as shown in FIG. 14, in each first touch electrode 111, except for portions at two ends, a shape of remaining portions of the first touch electrode 111 is composed of a plurality of rhombuses, and ends of two rhombuses that are adjacent to each other are directly connected together; in each second touch electrode 112, except for touch sub-electrodes 112a at two ends, the remaining touch sub-electrodes 112a each have a rhombus shape.

It will be noted that, the portions of each first touch electrode 111 at the two ends are two ends of the first touch electrode 111 in an extending direction thereof, and are located at edges of the touch area. Similarly, the touch sub-electrodes 112a at the two ends are two ends of the second touch electrode 112 in an extending direction thereof, and are located at edges of the touch area.

Based on this, since the shape of the remaining portions of the first touch electrode 111 except for the portions at the two ends is composed of the plurality of rhombuses that are directly connected, and the remaining touch sub-electrodes 112a each have the rhombus shape except for the touch sub-electrodes 112a at the two ends, shapes of the portions of the first touch electrode 111 at the two ends and the touch sub-electrodes 112a at the two ends may be set to isosceles triangles, and bottom sides of the isosceles triangles face edges of the touch area of the touch panel 100, so that the edges of the touch area 20 are also provided with the first touch electrode 111 and touch sub-electrodes 112a. In this way, it may be ensured that there is no touch blind region at the edges of the touch area 20.

Figure 17:
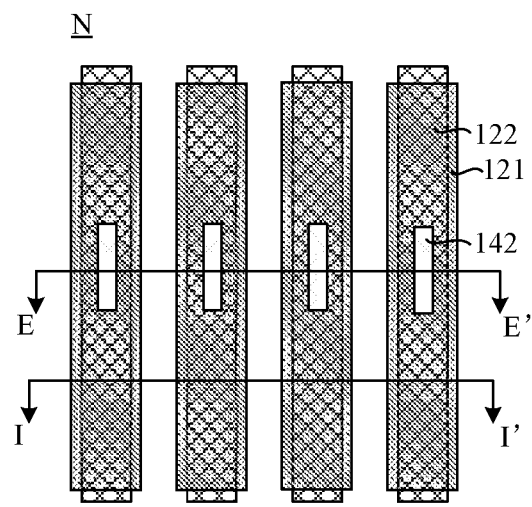
FIG. 17 is a partial enlargement view of the part N in FIG. 14.

In the case where the portions of the touch lines 12 located in the non-bendable region A4 are the double-layer metal lines, as shown in FIG. 17 (FIG. 17 being a partial enlargement view of the part N in FIG. 14), a double-layer metal line includes a first metal line 121 and a second metal line 122. In some embodiments, first metal lines 121 are disposed in the same layer as the first touch electrodes 111 and the touch sub-electrodes 112a, and second metal lines 122 are disposed in the same layer as the connection portions 112b.

Base on this, for example, as shown in FIG. 17, an orthogonal projection of the first metal line 121 on the carrier panel 10 approximately overlaps with an orthogonal projection of the second metal line 122 on the carrier panel 10.

Figure 19:
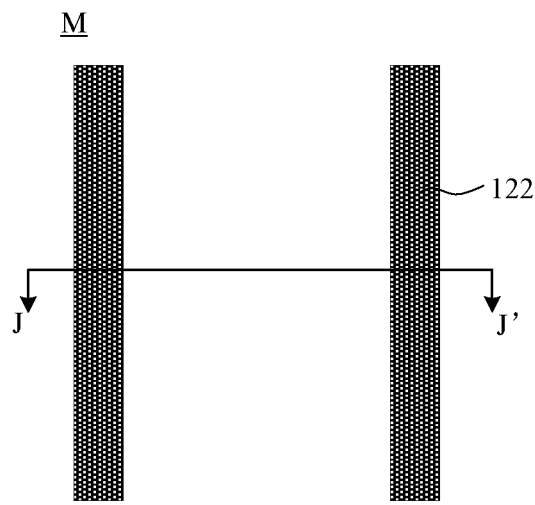
FIG. 19 is a partial enlargement view of the part M in FIG. 14.
Figure 20:
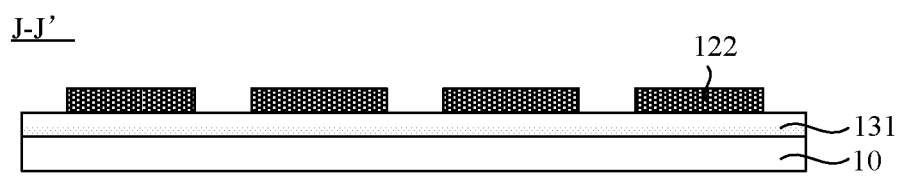
FIG. 20 is a sectional view taken along the line J-J' in FIG. 19.

In the case where the portions of the touch lines 12 located in the bendable region A3 are the single-layer metal lines, as shown in FIG. 19 (FIG. 19 being a partial enlargement view of the part M in FIG. 14), a single-layer metal line may be disposed in the same layer as the first metal line 121 or the second metal line 122. FIG. 19 is illustrated by taking an example in which single-layer metal lines have the same structure as second metal lines 122. Based on this, the single-layer metal lines may be disposed in the same layer as the first touch electrodes 111 and the touch sub-electrodes 112a, alternatively may be disposed in the same layer as the connection portions 112b. Referring to FIG. 20 (FIG. 20 being a sectional view taken along the line J-J' in FIG. 19), the single-layer metal lines and the connection portions are disposed in the same layer, that is, the single-layer metal lines are disposed on the side of the first insulating layer 131 away from the carrier panel 10.

Figure 18A:
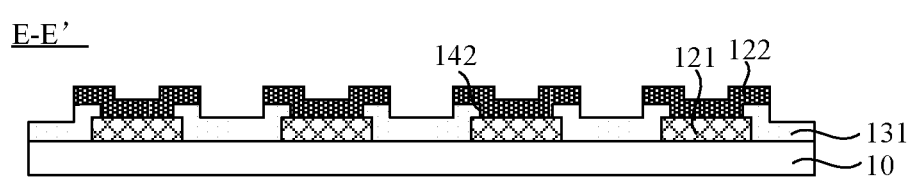
FIG. 18A is a sectional view taken along the line E-E' in FIG. 17.
Figure 18B:
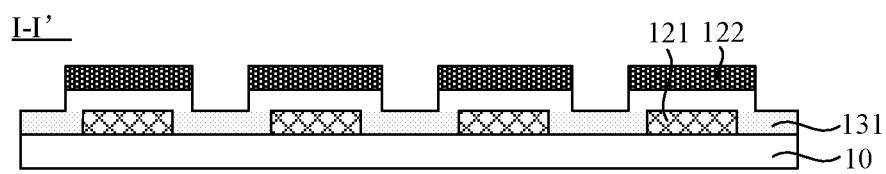
FIG. 18B is a sectional view taken along the line I-I' in FIG. 17.

In some embodiments, the orthogonal projections of the first touch electrodes 111 and the touch sub-electrodes 112a on the first insulating layer 131 are within the boundary of the first insulating layer 131, and the first insulating layer 131 may further provided in the wiring area of the touch panel 100. In this case, as shown in FIG. 18A (FIG. 18A being a sectional view taken along the line E-E' in FIG. 17), the first metal lines 121 and the second metal lines 122 are located on both sides of the first insulating layer 131. The first insulating layer 131 has second via holes, and a first metal line 121 and a second metal line 122 are electrically connected through a second via hole 142 in the first insulating layer 131. As shown in FIG. 18B (FIG. 18B is a sectional view taken along the line II' in FIG. 17), the first metal lines 121 and the second metal lines 122 are located on the both sides of a portion of the first insulating layer 131 that is not provided with via holes.

Figure 21A:
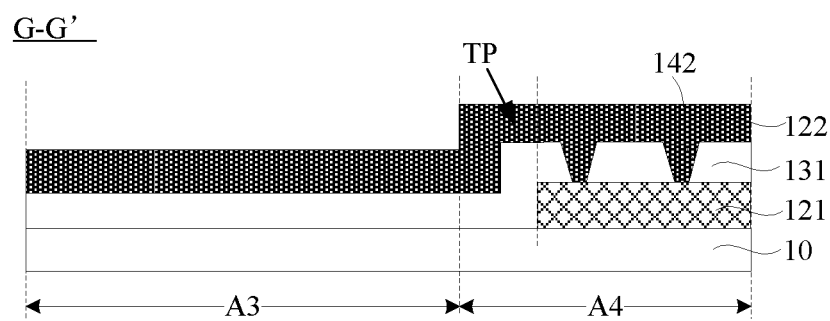
FIG. 21A is a sectional view taken along the line G-G' in FIG. 14.

FIGS. 21A and 21B are sectional views taken along the line G-G' in FIG. 14. In the case where the first insulating layer 131 is further provided in the wiring area of the touch panel 100, FIG. 21A illustrates a transition portion TP between the single-layer metal line of a touch line located in the bendable region A3 and the double-layer metal line thereof located in the non-bendable region A4. In addition, referring to FIG. 21A, of each touch line 12 of the plurality of touch lines 12, the single-layer metal line located in the bendable region A3 and the second metal line 122 of the double-layer metal line located in the non-bendable region A4 are disposed in the same layer, and the single-layer metal line is connected to the second metal line 122 to form an integrated structure. Referring to FIG. 21B, of each touch line 12 of the plurality of touch lines 12, the single-layer metal line located in the bendable region A3 and the first metal line 121 of the double-layer metal line located in the non-bendable region A4 are disposed in the same layer, and the single-layer metal line is connected to the first metal line 121 to form an integrated structure.

In some other embodiments, referring to FIG. 14, the orthogonal projections of the first touch electrodes 111 and the touch sub-electrodes 112a on the first insulating layer 131 are within the boundary of the first insulating layer 131, and the first insulating layer 131 is only provided in the touch area of the touch panel 100. In this case, as shown in FIG. 21C (FIG. 21C being a sectional view taken along the line G-G' in FIG. 14 in the case where the first insulating layer 131 is not disposed in the wiring area of the touch panel 100), the first metal line 121 and the second metal line 122 of the touch line 12 located in the wiring area are directly attached together, that is, there is no first insulating layer 131 between the first metal line 121 and the second metal line 122.

Some embodiments of the present disclosure provide a manufacturing method for a touch panel 100, which is used to manufacture the above touch panel 100.

As shown in FIG. 22, the manufacturing method for the touch panel 100 includes following steps.

In S10, a plurality of touch electrodes 11 and a plurality of touch lines 12 are formed on a carrier panel 10, and a touch electrode 11 of the plurality of touch electrodes is electrically connected to one or more touch lines 12.

The carrier panel 10 has a bendable region A3 and a non-bendable region A4. A portion of at least one touch line 12 located in the bendable region A3 is a single-layer metal line, and at least a part of a portion of the at least one touch line 12 located in the non-bendable region A4 is a double-layer metal line.

It will be understood that, at least a portion of at least one touch electrode 11 of the plurality of touch electrodes 11 formed may be provided with a metal mesh structure.

In some embodiments of the present disclosure, the manufacturing method for the touch panel 100 has the same structure and beneficial effects as the above touch panel 100, and details may be referred to the above embodiments, which will not be repeated herein.

In some embodiments, referring to FIGS. 14 and 23, the S10 includes following steps.

In S100, a first metal film is formed, and the first metal film is patterned to form a first metal pattern layer. The first metal pattern layer includes a plurality of first touch electrodes 111, a plurality of touch sub-electrodes 112a, and a plurality of first metal lines 121. A first touch electrode 111 is a whole electrode, and the plurality of touch sub-electrodes 112a are arranged in an array.

Herein, patterning the first metal film means that masking, exposing, developing, and etching the first metal film.

It will be understood that, the plurality of first touch electrodes 111, the plurality of touch sub-electrodes 112a, and the plurality of first metal lines 121 are disposed in a same layer.

In S101, a first insulating layer 131 is formed. The first insulating layer 131 is provided with first via holes 141 and second via hole(s) 142.

In S102, a second metal film is formed, and the second metal film is patterned to form a second metal pattern layer. The second metal pattern layer includes a plurality of connection portions 112b and a plurality of second metal lines 122. Each connection portion 112b of the plurality of connection portions 112b electrically connects two adjacent touch sub-electrodes 112a through at least two first via holes 141 to form a second touch electrode, and a connection portion 112b and a first touch electrode 111 have a cross region. A first metal line 121 and a second metal line 122 are electrically connected through at least one second via hole 142 to form the double-layer metal line. The first metal pattern layer or the second metal pattern layer further includes the single-layer metal line.

Herein, patterning the second metal film means that masking, exposing, developing, and etching the second metal film.

In addition, the first via holes 141 are used to electrically connect the connection portion 112b and the two adjacent touch sub-electrodes 112a, and the second via hole 142 is used to electrically connect the first metal line 121 and the second metal line 122.

It will be understood that, the connection portions 112b and the second metal lines 122 are disposed in a same layer.

It will be noted that, in the case where portions of the plurality of touch lines 12 located in the bendable region A3 are the single-layer metal lines, the formed first metal pattern layer or the second metal pattern layer includes the single-layer metal lines.

In addition, a sequence of forming the first touch electrodes 111, the touch sub-electrodes 112a and the first metal lines 121 and forming the connection portions 112b and the second metal lines 122 is not limited. It may be that the first metal film may be patterned first to form the first touch electrodes 111, the touch sub-electrodes 112a and the first metal lines 121, and then the second metal film may be patterned to form the connection portions 112b and the second metal lines 122. Alternatively, it may be that the second metal film may be patterned first to form the connection portions 112b and the second metal lines 122, and then the first metal film is patterned to form the first touch electrodes 111, touch sub-electrodes 112a and the first metal lines 121. The embodiments of the present disclosure do not limit thereto.

It will be understood that, the first touch electrodes 111, the touch sub-electrodes 112a, the connection portions 112b, the first metal lines 121 and the second metal lines 122 in some embodiments of the present disclosure have the same technical features and beneficial effects as the above embodiments, and details may be referred to the above embodiments, which will not be repeated herein.

Figure 24:
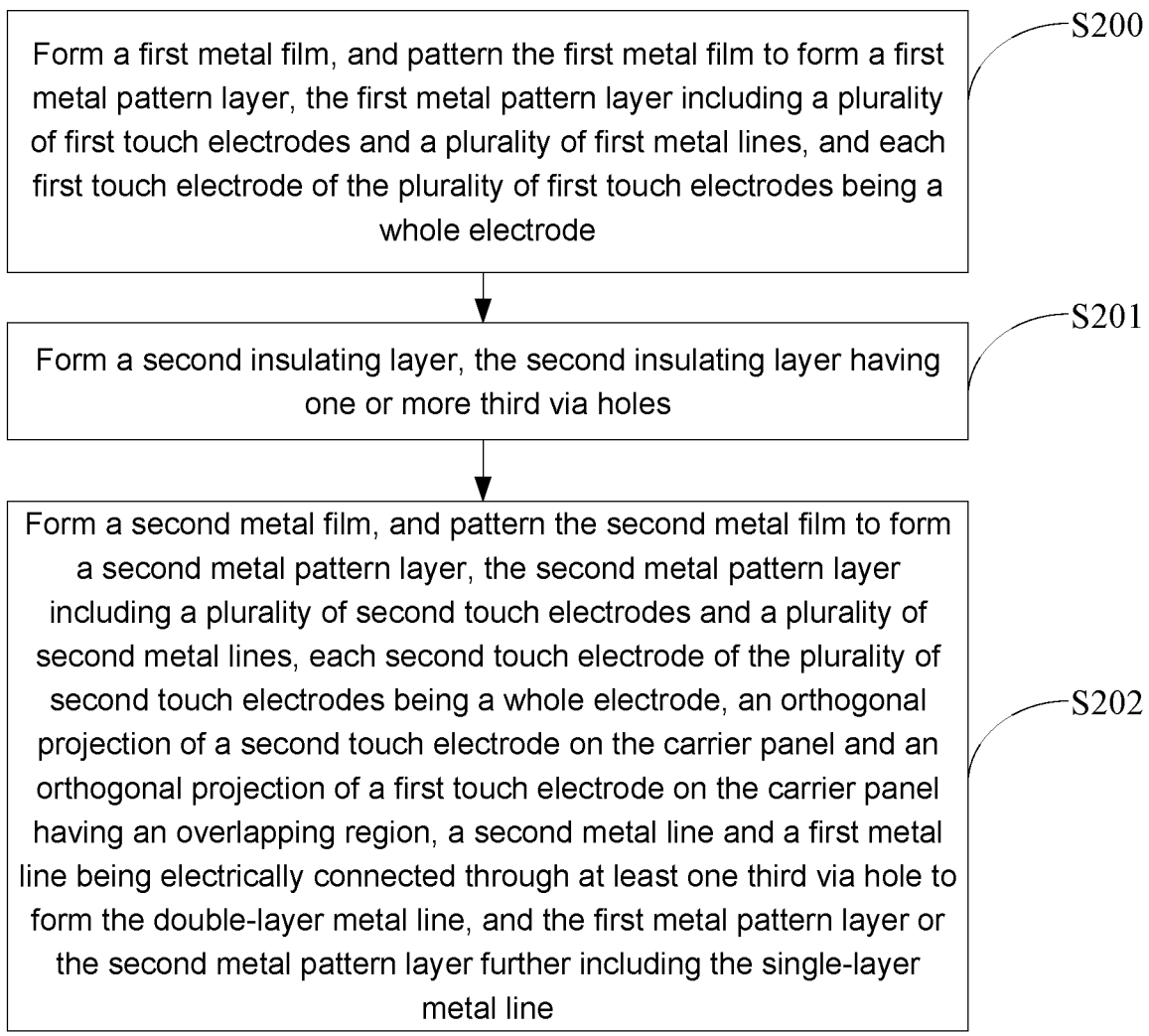
FIG. 24 is a flow diagram of a manufacturing method for yet another touch panel, in accordance with some embodiments.

In some embodiments, referring to FIGS. 10 and 24, the S10 includes following steps.

In S200, a first metal film is formed, and the first metal film is patterned to form a first metal pattern layer. The first metal pattern layer includes a plurality of first touch electrodes 111 and a plurality of first metal lines 121. Each first touch electrode 111 of the plurality of first touch electrodes 111 is a whole electrode.

In S201, a second insulating layer 132 is formed. The second insulating layer 132 has one or more third via holes 143.

In S202, a second metal film is formed, and the second metal film is patterned to form a second metal pattern layer. The second metal pattern layer includes a plurality of second touch electrodes 112 and a plurality of second metal lines 122. Each second touch electrode 112 of the plurality of second touch electrodes 112 is a whole electrode. A second touch electrode 112 and a first touch electrode 111 have a cross region. A second metal line 122 and a first metal line 121 are electrically connected through at least one third via hole 143 to form the double-layer metal line. The first metal pattern layer or the second metal pattern layer further includes the single-layer metal line.

It will be noted that, in the case where portions of the plurality of touch lines 12 located in the bendable region A3 are the single-layer metal lines, the formed first metal pattern layer or the second metal pattern layer includes the single-layer metal lines.

In addition, a sequence of forming the first touch electrodes 111 and the first metal lines 121 and forming the second touch electrodes 112 and the second metal lines 122 is not limited. The sequence of the formations is not described herein.

Figure 25:
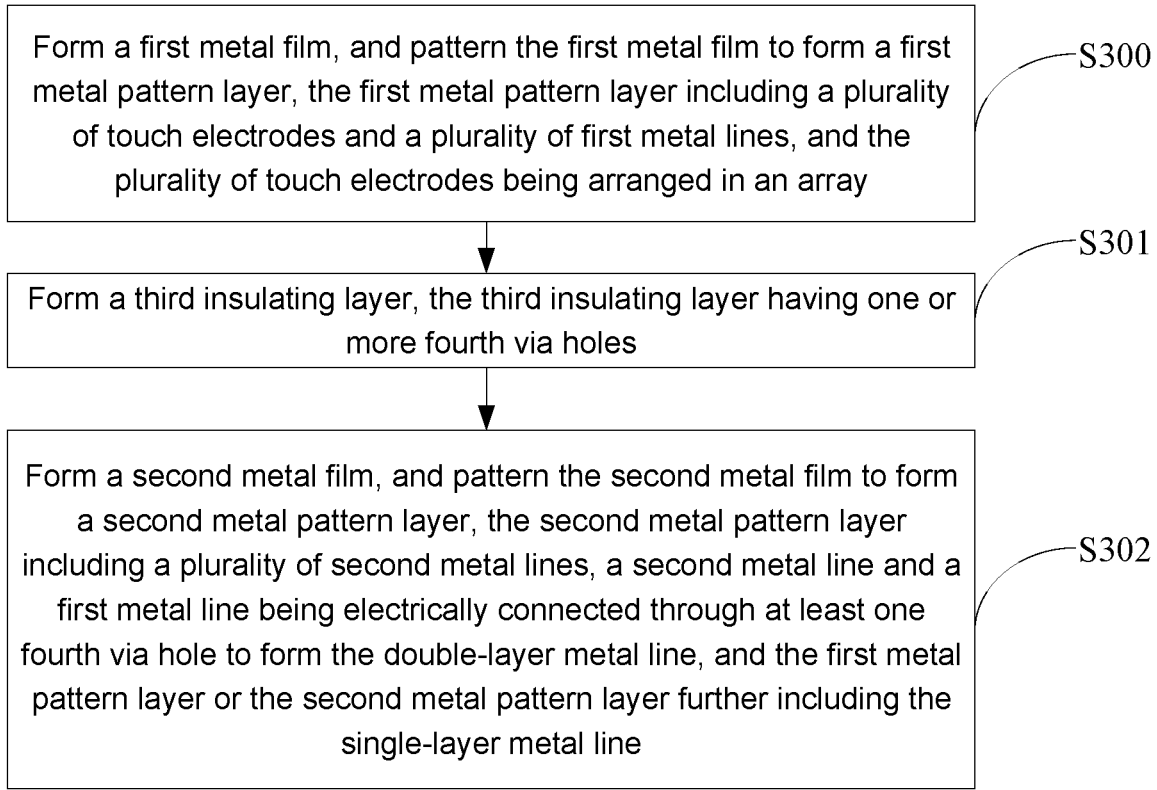
FIG. 25 is a flow diagram of a manufacturing method for yet another touch panel, in accordance with some embodiments.

In some embodiments, referring to FIGS. 6, 7 and 25, the S10 includes following steps.

In S300, a first metal film is formed, and the first metal film is patterned to form a first metal pattern layer. The first metal pattern layer includes a plurality of touch electrodes 11 and a plurality of first metal lines 121. The plurality of touch electrodes 11 are arranged in an array.

In S301, a third insulating layer 133 is formed. The third insulating layer 133 has one or more fourth via holes 144.

In S302, a second metal film is formed, and the second metal film is patterned to form a second metal pattern layer. The second metal pattern layer includes a plurality of second metal lines 122. A second metal line 122 and a first metal line 121 are electrically connected through at least one fourth via hole 144 to form the double-layer metal line. The first metal pattern layer or the second metal pattern layer further includes the single-layer metal line.

It will be noted that, in the case where portions of the plurality of touch lines 12 located in the bendable region A3 are the single-layer metal lines, the formed first metal pattern layer or the second metal pattern layer includes the single-layer metal lines.

In addition, a sequence of forming the touch electrodes 11 and the first metal lines 121 and forming the second metal lines 122 is not limited. The sequence of the formations is not described herein. For example, the first metal lines 121 may be formed after the second metal pattern layer is formed, in this case, an insulating layer needs to be provided among different layers, a first metal line 121 and a second metal line 122 are connected in parallel through via hole(s) in the insulating layer, and the second metal line 122 and a touch electrode 11 are electrically connected through via hole(s).

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A touch panel, the touch panel having a touch area and a wiring area, and comprising:
   a carrier panel, the carrier panel having a bendable region and a non-bendable region, and the non-bendable region of the carrier panel at least partially overlapping with the touch area of the touch panel; and
   a plurality of touch electrodes and a plurality of touch lines that are disposed on the carrier panel, a touch electrode of the plurality of touch electrodes being electrically connected to one or more touch lines; wherein
   a portion of at least one touch line located in the bendable region is a single-layer metal line, and at least a part of a portion of the at least one touch line located in the non-bendable region is a double-layer metal line.

2. The touch panel according to claim 1, wherein all of the portion of the at least one touch line located in the non-bendable region is a double-layer metal line.

3. The touch panel according to claim 1, wherein the plurality of touch electrodes are arranged in an array, and each touch line is connected to a touch electrode of the plurality of touch electrodes;
   the touch panel further comprises a third insulating layer located on a side of the plurality of touch electrodes away from the carrier panel; wherein
   the double-layer metal line includes a first metal line and a second metal line; the first metal line and the plurality of touch electrodes are disposed in a same layer, and the second metal line is disposed on a side of the third insulating layer away from the carrier panel; and the third insulating layer has one or more fourth via holes, the first metal line and the second metal line are electrically connected through at least one fourth via hole in the third insulating layer;
   and/or
   the single-layer metal line is disposed in a same layer as the plurality of touch electrodes or is located on the side of the third insulating layer away from the carrier panel.

4. The touch panel according to claim 1, wherein the bendable region is located in a middle or an edge of the touch panel.

5. A touch display apparatus, comprising the touch panel according to claim 1.

6. The touch panel according to claim 1, wherein
   the at least one touch line includes the plurality of touch lines; or
   the at least one touch line includes part of the plurality of touch lines, and each touch line of remaining part of the plurality of touch lines is all located in the non-bendable region, and is a double-layer metal line.

7. The touch panel according to claim 1, wherein the non-bendable region includes at least one adjacent region proximate to the bendable region, and a non-adjacent region located at a side of the adjacent region away from the bendable region;
   a portion of the at least one touch line located in the adjacent region is a single-layer metal line, and a portion of the at least one touch line located in the non-adjacent region is the double-layer metal line.

8. The touch panel according to claim 7, wherein a dimension of the adjacent region in a first direction is less than a dimension of the non-adjacent region in the first direction;
   wherein the first direction is parallel to a surface, provided with the plurality of touch electrodes and the plurality of touch lines thereon, of the carrier panel and perpendicular to a boundary of the bendable region proximate to the adjacent region.

9. The touch panel according to claim 1, wherein the plurality of touch electrodes include a plurality of first touch electrodes and a plurality of second touch electrodes, the plurality of first touch electrodes and the plurality of second touch electrodes are arranged crosswise and are insulated from each other.

10. The touch panel according to claim 9, wherein each first touch electrode of the plurality of first touch electrodes is a whole electrode; and each second touch electrode of the plurality of second touch electrodes includes a plurality of touch sub-electrodes and a plurality of connection portions, two adjacent touch sub-electrodes in the second touch electrode are separated by a first touch electrode;
   the touch panel further comprises a first insulating layer; wherein
   the plurality of first touch electrodes and the plurality of touch sub-electrodes are disposed in a same layer, and the plurality of first touch electrodes and the plurality of connection portions are located on both sides of the first insulating layer.

11. The touch panel according to claim 10, wherein the first insulating layer has a plurality of first via holes, the two adjacent touch sub-electrodes in the second touch electrode are electrically connected to a connection portion of the plurality of connection portions through at least two first via holes in the first insulating layer.

12. The touch panel according to claim 10, wherein the first touch electrodes and the touch sub-electrodes each have a metal mesh structure.

13. The touch panel according to claim 10, wherein the double-layer metal line includes a first metal line and a second metal line; the first metal line and the plurality of first touch electrodes are disposed in a same layer, and the second metal line and the plurality of connection portions are disposed in a same layer;

and/or the single-layer metal line is disposed in a same layer as the plurality of first touch electrodes or the plurality of connection portions.

14. The touch panel according to claim 13, wherein the double-layer metal line includes the first metal line and the second metal line; the first metal line and the second metal line are located on the both sides of the first insulating layer; and the first insulating layer further has one or more second via holes, the first metal line and the second metal line are electrically connected through at least one second via hole in the first insulating layer.

15. The touch panel according to claim 13, wherein an orthogonal projection of the first metal line on the carrier panel approximately overlaps with an orthogonal projection of the second metal line on the carrier panel.

16. The touch panel according to claim 9, wherein each first touch electrode of the plurality of first touch electrodes is a whole electrode, and each second touch electrode of the plurality of second touch electrodes is a whole electrode;

the touch panel further comprises a second insulating layer disposed between the plurality of first touch electrodes and the plurality of second touch electrodes; wherein the double-layer metal line includes a first metal line and a second metal line; the first metal line and the plurality of first touch electrodes are disposed in a same layer, and the second metal line and the plurality of second touch electrodes are disposed in a same layer; the second insulating layer further has one or more third via holes, the first metal line and the second metal line are electrically connected through at least one third via hole in the second insulating layer;

and/or the single-layer metal line is disposed in a same layer as the plurality of first touch electrodes or the plurality of second touch electrodes.

17. A manufacturing method for a touch panel, comprising:

forming a plurality of touch electrodes and a plurality of touch lines on a carrier panel, a touch electrode of the plurality of touch electrodes being electrically connected to one or more touch lines; wherein the touch panel has a touch area and a wiring area, the carrier panel has a bendable region and a non-bendable region, the non-bendable region of the carrier panel at least partially overlaps with the touch area of the touch panel, a portion of at least one touch line located in the bendable region is a single-layer metal line, and at least a part of a portion of the at least one touch line located in the non-bendable region is a double-layer metal line.

18. The method according to claim 17, wherein forming the plurality of touch electrodes and the plurality of touch lines on the carrier panel, includes:

forming a first metal film;

patterning the first metal film to form a first metal pattern layer, the first metal pattern layer including a plurality of first touch electrodes, a plurality of touch sub-electrodes and a plurality of first metal lines; wherein each first touch electrode of the plurality of first touch electrodes is a whole electrode, the plurality of touch sub-electrodes are arranged in an array; two adjacent touch sub-electrodes are separated by a first touch electrode;

forming a first insulating layer, the first insulating layer having a plurality of first via holes and one or more second via holes;

forming a second metal film; and patterning the second metal film to form a second metal pattern layer, the second metal pattern layer including a plurality of connection portions and a plurality of second metal lines;

wherein each connection portion of the plurality of connection portions electrically connects two adjacent touch sub-electrodes through at least two first via holes to form a second touch electrode, a connection portion and a first touch electrode have a cross region; a first metal line and a second metal line are electrically connected through at least one second via hole to form the double-layer metal line; and the first metal pattern layer or the second metal pattern layer further includes the single-layer metal line.

19. The method according to claim 17, wherein forming the plurality of touch electrodes and the plurality of touch lines on the carrier panel, includes:

forming a first metal film;

patterning the first metal film to form a first metal pattern layer, the first metal pattern layer including a plurality of first touch electrodes and a plurality of first metal lines; wherein each first touch electrode of the plurality of first touch electrodes is a whole electrode;

forming a second insulating layer, the second insulating layer having one or more third via holes;

forming a second metal film; and patterning the second metal film to form a second metal pattern layer, the second metal pattern layer including a plurality of second touch electrodes and a plurality of second metal lines;

wherein each second touch electrode of the plurality of second touch electrodes is a whole electrode, a second touch electrode and a first touch electrode have a cross region, a second metal line and a first metal line are electrically connected through at least one third via hole to form the double-layer metal line; and the first metal pattern layer or the second metal pattern layer further includes the single-layer metal line.

20. The method according to claim 17, wherein forming the plurality of touch electrodes and the plurality of touch lines on the carrier panel, includes:

forming a first metal film;

patterning the first metal film to form a first metal pattern layer, the first metal pattern layer including a plurality of touch electrodes and a plurality of first metal lines, wherein the plurality of touch electrodes are arranged in an array;

forming a third insulating layer, the third insulating layer having one or more fourth via holes;

forming a second metal film; and patterning the second metal film to form a second metal pattern layer, the second metal pattern layer including a plurality of second metal lines;

wherein a second metal line and a first metal line are electrically connected through at least one fourth via hole to form the double-layer metal line; and the first metal pattern layer or the second metal pattern layer further includes the single-layer metal line.

* * * * *